(12) United States Patent
Kim et al.

(10) Patent No.: US 9,190,630 B2
(45) Date of Patent: Nov. 17, 2015

(54) FLEXIBLE ORGANIC ELECTROLUMINESCENT DEVICE AND METHOD FOR FABRICATING THE SAME

(71) Applicant: LG DISPLAY CO., LTD., Seoul (KR)

(72) Inventors: DoHyung Kim, Paju-si (KR); Taro Hasumi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 54 days.

(21) Appl. No.: 14/074,399

(22) Filed: Nov. 7, 2013

(65) Prior Publication Data

US 2014/0131683 A1 May 15, 2014

(30) Foreign Application Priority Data

Nov. 9, 2012 (KR) ............ 10-2012-0126908

(51) Int. Cl.
- H01L 35/24 (2006.01)
- H01L 51/56 (2006.01)
- H01L 51/52 (2006.01)
- H01L 27/32 (2006.01)

(52) U.S. Cl.
CPC ............ *H01L 51/56* (2013.01); *H01L 27/3246* (2013.01); *H01L 51/5253* (2013.01); *H01L 2251/566* (2013.01)

(58) Field of Classification Search
CPC ............................ H01L 27/32; H01L 27/3262
USPC ............................................. 257/40; 438/22
See application file for complete search history.

(56) References Cited

U.S. PATENT DOCUMENTS

2014/0117336 A1* 5/2014 Kim et al. .............. 257/40

\* cited by examiner

*Primary Examiner* — Theresa T Doan
(74) *Attorney, Agent, or Firm* — Dentons US LLP

(57) ABSTRACT

Provided is a flexible organic electroluminescent device and a method for fabricating the same. The device includes a switching thin film transistor and a drive thin film transistor formed at an each pixel region on the substrate; an interlayer insulating layer formed on the substrate; a partition wall pattern formed in the non-display area of the substrate; a first electrode formed on the interlayer insulating layer; a bank formed around each pixel region; an organic light emitting layer separately formed on the first electrode; a second electrode formed on an entire surface of the display area; a first passivation layer formed on an entire surface of the substrate; an organic layer and a second passivation layer formed on the first passivation layer of the display area; a barrier film located to face the substrate.

5 Claims, 14 Drawing Sheets

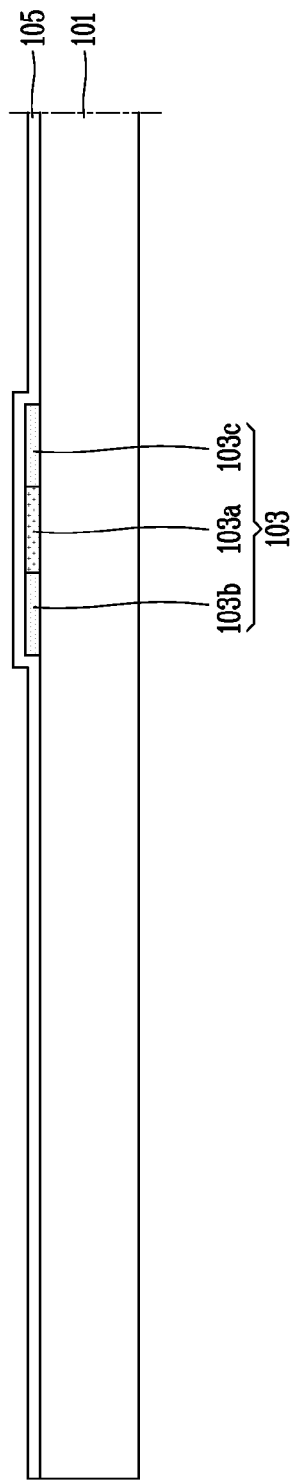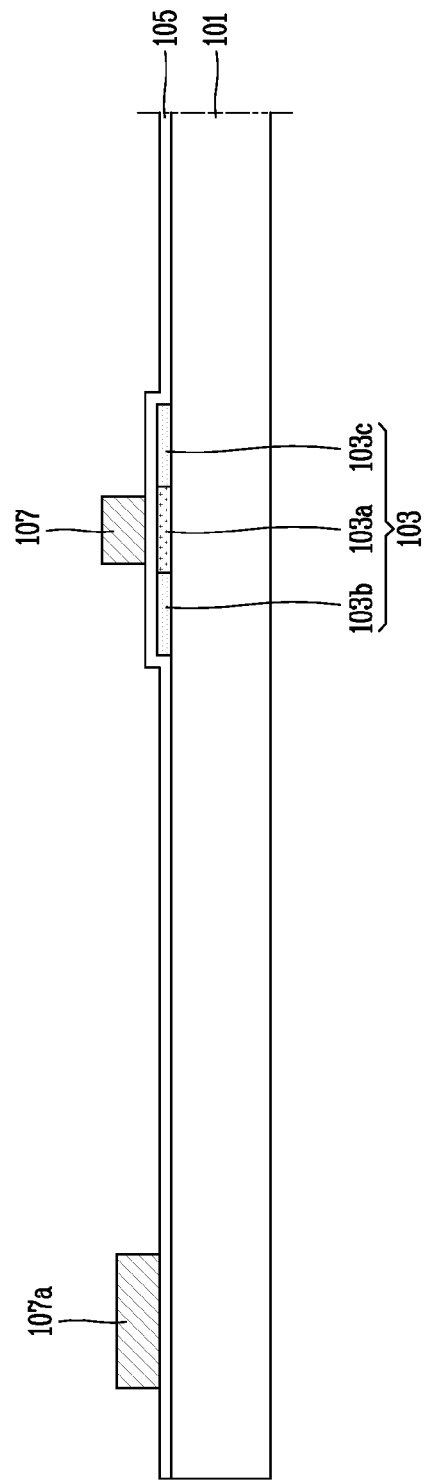

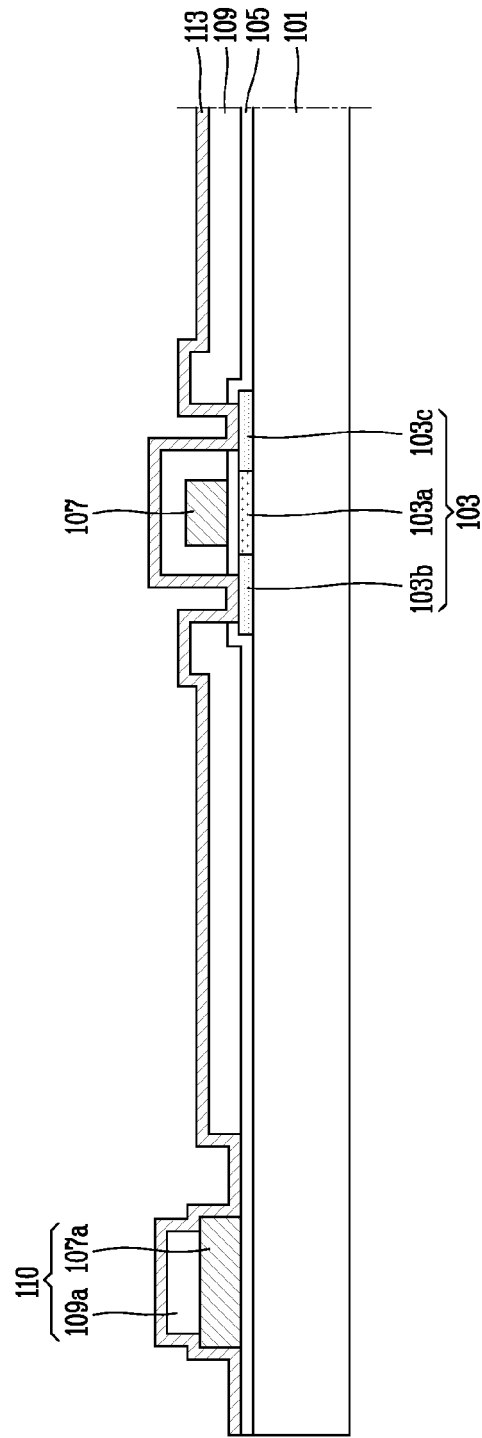
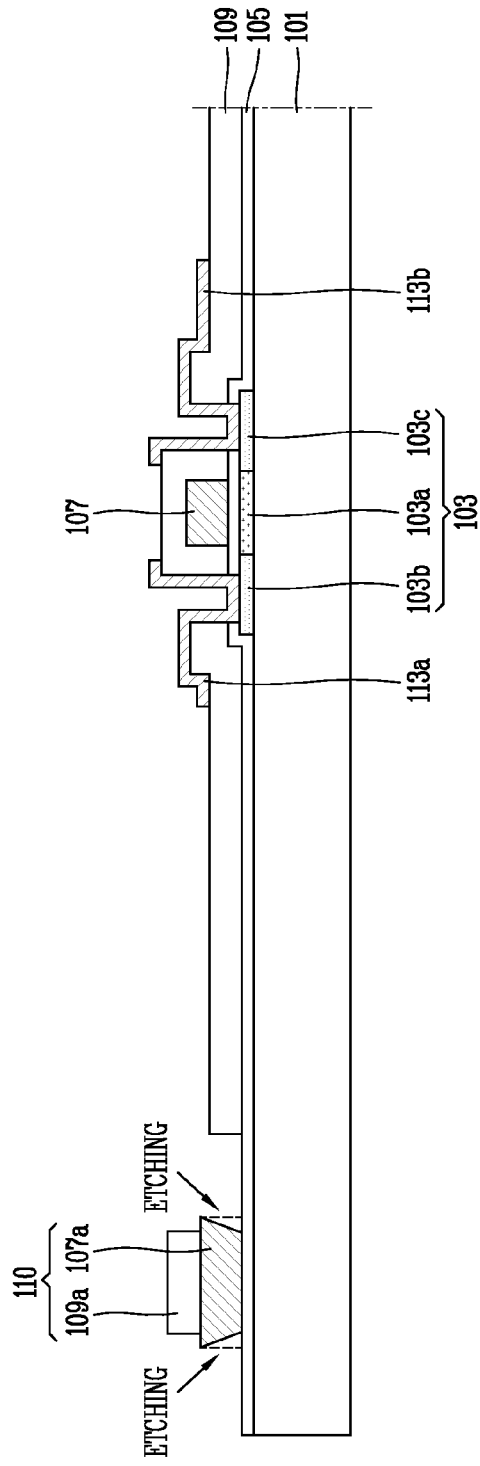

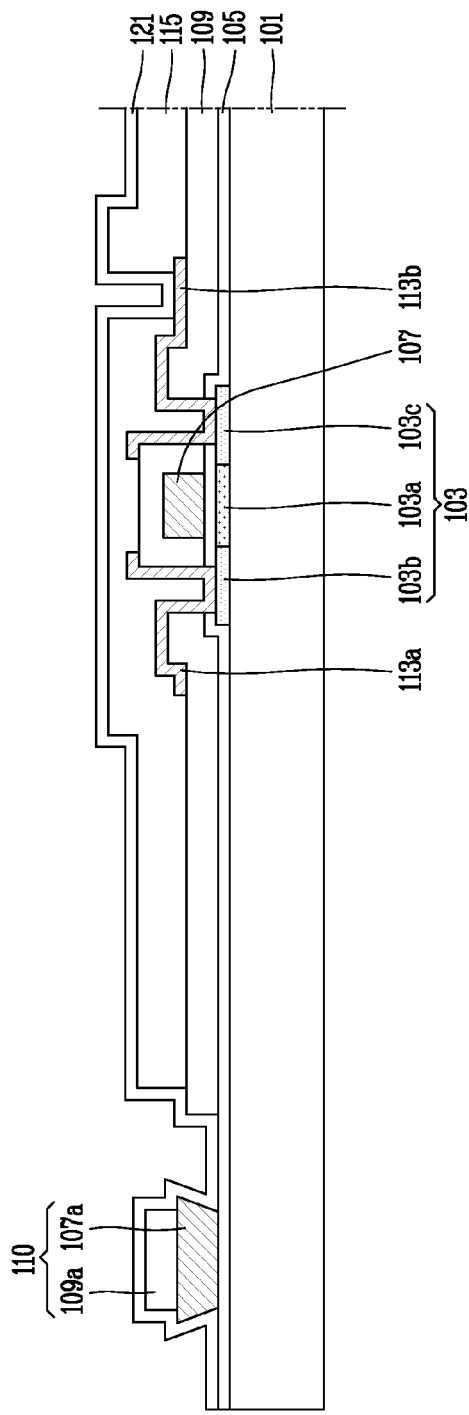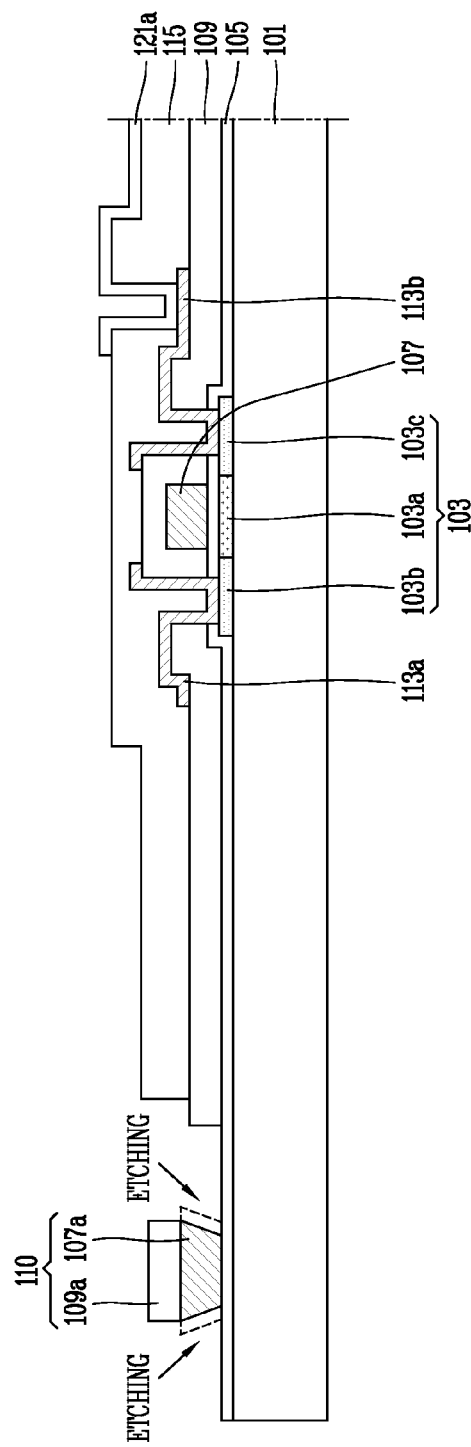

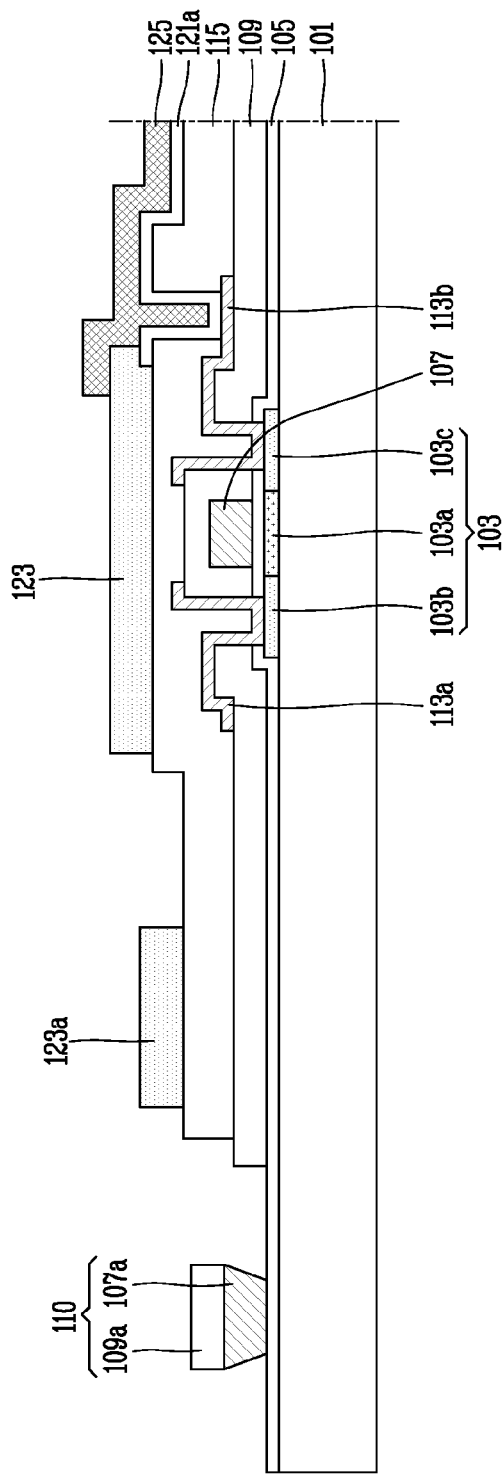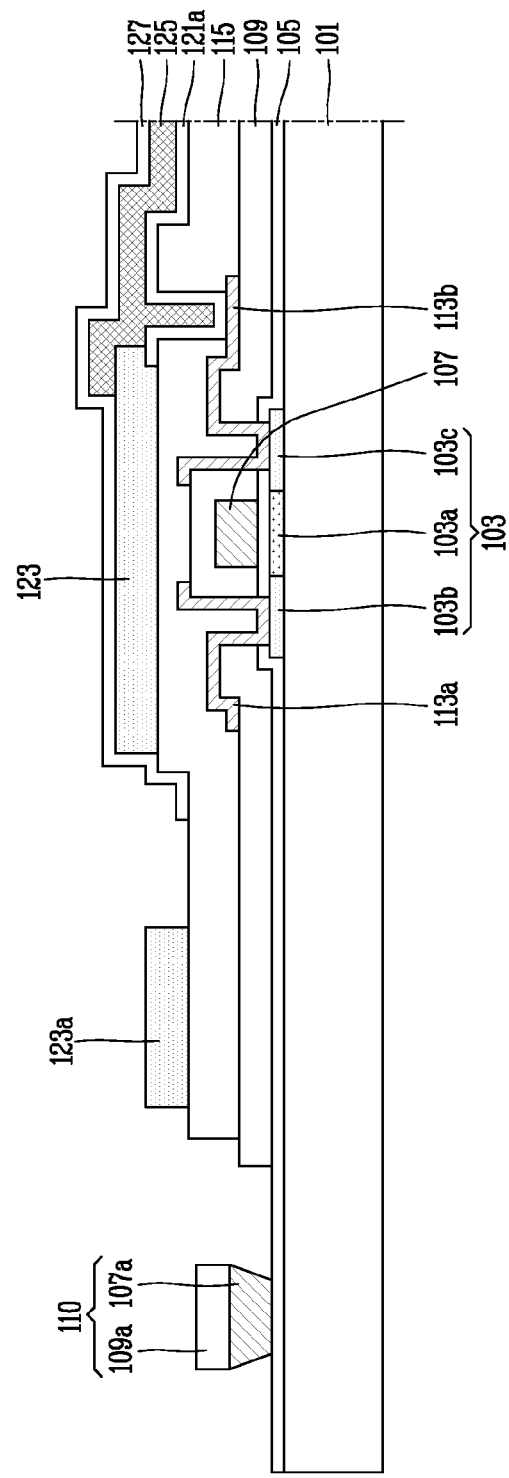

FLEXIBLE ORGANIC ELECTROLUMINESCENT DEVICE AND METHOD FOR FABRICATING THE SAME

CROSS REFERENCE TO RELATED APPLICATIONS

The present application claims the benefit of Korean Patent Application No. 10-2012-0126908 filed in Korea on Nov. 9, 2012 which is hereby incorporated by reference for all purposes as if fully set forth herein.

BACKGROUND OF THE INVENTION

1. Field of the Invention

The present invention relates to an organic electroluminescent device (hereinafter, referred to as an "OLED"). More particularly, the present invention relates to a flexible organic electroluminescent device for blocking moisture from being infiltrated into the organic electroluminescent device to enhance the life of the organic electroluminescent device, and a method for fabricating the same.

2. Discussion of the Related Art

An organic electroluminescent device, which is one type of flat panel display (FPDs), may have high brightness and low operation voltage characteristics. Furthermore, the organic electroluminescent device has a high contrast ratio because of being operated as a self-luminous type display that spontaneously emits light, and allows the implementation of an ultra-thin display. Furthermore, the organic light-emitting diode has advantages such as facilitating the implementation of moving images using a response time of several microseconds (μs), having no limitation in viewing angle, having stability even at low temperatures, and being driven at low voltages between DC 5 to 15 V, thus facilitating the fabrication and design of a driving circuit thereof.

Furthermore, the fabrication process of the organic electroluminescent device can be carried out using only deposition and encapsulation equipment, and therefore the fabrication process is very simple.

The organic light-emitting diode having such characteristics can be largely divided into a passive matrix type and an active matrix type. In the passive matrix type, a device may be configured with a matrix form in which the scan and signal lines are crossed with each other, and the scan lines are sequentially driven as time passes to drive each pixel. Thus, instantaneous brightness as much as average brightness multiplied by the number of lines may be required to display the average brightness.

The active matrix type has a structure in which thin-film transistors, which are switching devices for turning on or off a pixel region, are located in each pixel region, and drive transistors connected to the switching transistors are connected to a power line and organic light emitting diodes, and formed in each pixel region.

Here, a first electrode connected to the drive transistor may be turned on or off in the pixel region unit, and a second electrode facing the first electrode may perform the role of a common electrode, thereby implementing an organic light emitting diode along with an organic light emitting layer interposed between the two electrodes.

In the active matrix type having such characteristics, a voltage applied to the pixel region may be charged at a storage capacitance (Cst), and applied until the next frame signal is applied and thus continuously driven for one screen regardless of the number of scan lines.

Accordingly, the same brightness can be obtained even if a low current is applied, thereby having an advantage of providing low power consumption, fine pitch and large screen sized display, and thus in recent years, active matrix type organic electroluminescent devices have been widely used.

The fundamental structure and operating characteristics of such an active matrix type organic electroluminescent device will be described below with reference to the accompanying drawings.

FIG. 1 is a circuit diagram for one pixel region in a typical active matrix type organic electroluminescent device.

Referring to FIG. 1, one pixel region of a typical active matrix type organic electroluminescent device 10 may include a switching thin film transistor (STr), a drive thin film transistor (DTr), a storage capacitor (Cst), and an organic light emitting diode (E).

A gate line (GL) is formed in the first direction, and a data line (DL) disposed in the second direction crossed with the first direction to define a pixel region (P) along with the gate line (GL) is formed, and a power line (PL) separated from the data line (DL) to apply a power voltage is formed.

Furthermore, a switching thin film transistor (STr) is formed at a portion where the data line (DL) and gate line (GL) are crossed with each other, and a drive thin film transistor (DTr) electrically connected to the switching thin film transistor (STr) is formed within the each pixel region (P).

Here, the drive thin film transistor (DTr) is electrically connected to the organic light emitting diode (E). In other words, a first electrode, which is one side terminal of the organic light emitting diode (E), is connected to a drain electrode of the drive thin film transistor (DTr), and a second electrode, which is the other terminal thereof, is connected to the power line (PL). Here, the power line (PL) transfers a power voltage to the organic light emitting diode (E). Furthermore, a storage capacitor (Cst) is formed between a gate electrode and a source electrode of the drive thin film transistor (DTr).

Accordingly, when a signal is applied through the gate line (GL), the switching thin film transistor (STr) is turned on, and the signal of the data line (DL) is transferred to the gate electrode of the drive thin film transistor (DTr) to turn on the drive thin film transistor (DTr), thereby emitting light through the organic light emitting diode (E). Here, when the drive thin film transistor (DTr) is in a turned-on state, the level of a current flowing through the organic light emitting diode (E) from the power line (PL) is determined, and due to this, the organic light emitting diode (E) may implement a gray scale, and the storage capacitor (Cst) may perform the role of constantly maintaining the gate voltage of the drive thin film transistor (DTr) when the switching thin film transistor (STr) is turned off, thereby allowing the level of a current flowing through the organic light emitting diode (E) to be constantly maintained up to the next frame even when the switching thin film transistor (STr) is in an off state.

FIG. 2 is a plan view schematically illustrating an organic electroluminescent device according to the related art.

FIG. 3 is a schematic cross-sectional view of an organic electroluminescent device along line III-III in FIG. 2 according to the related art.

Referring to FIG. 2, according to an organic electroluminescent device 10 according to the related art, a display area (AA) is defined on a substrate 11, and a non-display area (NA) is defined at the outside of the display area (AA), and a plurality of pixel regions (P), each defined as a region surrounded by the gate line (not shown) and the data line (not shown) are provided, and the power line (not shown) is provided in parallel to the data line (not shown) in the display area (AA).

Here, a switching thin film transistor (ST) (not shown) and a drive thin film transistor (DTr) (not shown) are formed in the plurality of pixel regions (SP), respectively, and connected to the drive thin film transistor (DTr).

According to an organic electroluminescent device 10 according to the related art, the substrate 11 formed with the drive thin film transistor (DTr) and organic light emitting diode (E) is encapsulated by a passivation layer (not shown).

Specifically describing the organic electroluminescent device 10 according to the related art, as illustrated in FIG. 3, the display area (AA) is defined, and the non-display area (NA) is defined at the outside of the display area (AA) on the substrate 11, and a plurality of pixel regions (P), each defined as a region surrounded by the gate line (not shown) and the data line (not shown) are provided, and the power line (not shown) is provided in parallel to the data line (not shown) in the display area (AA).

Here, an insulation material, for example, a buffer layer (not shown) formed of silicon oxide ($SiO_2$) or silicon nitride (NiNx), which is an inorganic insulation material, is provided on the substrate 11.

Furthermore, a semiconductor layer 13 made of pure polysilicon to correspond to the drive region (not shown) and switching region (not shown), respectively, and comprised of a first region 13a forming a channel at the central portion thereof and second regions 13b, 13c in which a high concentration of impurities are doped at both lateral surfaces of the first region 13a is formed at each pixel region (P) within the display area (AA) at an upper portion of the buffer layer (not shown).

A gate insulating layer 15 is formed on the buffer layer (not shown) including the semiconductor layer 13, and the drive region (not shown) and switching region (not shown) are provided on the gate insulating layer 15, and thus a gate electrode 17 is formed to correspond to the first region 13a of each of the semiconductor layer 13.

Furthermore, a gate line (not shown) connected to a gate electrode 17 formed in the switching region (not shown) and extended in one direction is formed on the gate insulating layer 15.

On the other hand, an interlayer insulating layer 19 is formed on an entire surface of the display area at an upper portion of the gate electrode 17 and gate line (not shown). Here, a semiconductor layer contact hole (not shown) for exposing the second regions 13b, 13c, respectively, located at both lateral surfaces of the first region 13a of each of the semiconductor layer, is provided on the interlayer insulating layer 19 and the gate insulating layer 15 at a lower portion thereof.

Furthermore, a data line (not shown) crossed with a gate line (not shown) to define the pixel region (P) and formed of a second metal material, and a power line (not shown) separated therefrom are formed at an upper portion of the interlayer insulating layer 19 including the semiconductor layer contact hole (not shown). Here, the power line (not shown) may be formed to be separated from and in parallel to the gate line (not shown) on a layer formed with the gate line (not shown), namely, the gate insulating layer.

In addition, a source electrode 23a and a drain electrode 23b brought into contact with the second regions 13b, 13c separated from each other, and respectively exposed through the semiconductor layer contact hole (not shown) and formed of the same second metal material as that of the data line (not shown) are formed in the each drive region (not shown) and switching region (not shown) on the interlayer insulating layer 19. Here, the semiconductor layer 13 and gate insulating layer 15 sequentially deposited on the drive region (not shown) and the gate electrode 17 and interlayer insulating layer 19 and the source electrode 23a and drain electrode 23b formed to be separated from each other forms a drive thin film transistor (DTr).

On the other hand, an organic insulating layer 25 having a drain contact hole (not shown) for exposing the drain electrode 23b of the drive thin film transistor (DTr) is formed on the drive thin film transistor (DTr) and switching thin film transistor (not shown).

Furthermore, a first electrode 31 brought into contact with the drain contact hole (not shown) through the drain electrode 23b and the drain contact hole (not shown) of the drive thin film transistor (DTr) and having a separated form for each pixel region (P) is formed on the organic insulating layer 25.

In addition, a bank 33 formed to divide each pixel region (P) is formed on the first electrode 31. Here, the bank 33 is disposed between adjoining pixel regions (Ps). Furthermore, the bank 33 is not only formed between adjoining pixel regions (Ps), but also part thereof 33a is formed in a panel edge portion, namely, non-display area (NA).

An organic light emitting layer 35 comprised of organic light emitting patterns (not shown) for emitting red, green and blue colors, respectively, is formed on the first electrode 31 within each of the pixel regions (Ps) surrounded by the bank 33.

Furthermore, a second electrode 37 is formed on an entire surface of the display area (AA) at an upper portion of the organic light emitting layer 35 and bank 33. Here, the first electrode 31 and second electrode 37 and the organic light emitting layer 35 interposed between the two electrodes 31, 37 form an organic light emitting diode (E).

On the other hand, a first passivation layer 39 is formed on an entire surface of the substrate including the second electrode 37 as an insulating layer for preventing moisture permeation.

Furthermore, an organic layer 41 made of a high organic molecular substance such as a polymer is formed in the display area (AA) on the first passivation layer 39.

In addition, a second passivation layer 43 made of an insulation material, for example, silicon oxide ($SiO_2$) or silicon nitride (SiNx) which is an inorganic insulation material, is additionally formed on the first passivation layer 39 including the organic layer 41 to block moisture from being infiltrated through the organic layer 41.

Moreover, a barrier film 47 for the encapsulation of the organic light emitting diode (E) and the prevention of upper moisture permeation is located on an entire surface of the substrate including the second passivation layer 43 to face the substrate, and a press sensitive adhesive (hereinafter, referred to as a "PSA") 45 is completely attached to and interposed between the substrate 11 and barrier film 47 with no air layer. Here, the second passivation layer 43, the press sensitive adhesive 45, and the barrier film 47 form a face seal structure.

In this manner, the substrate 11 is fixed to the barrier film 47 through the adhesive 45 to form a panel, thereby configuring the organic electroluminescent device 10 according to the related art.

However, according to an organic electroluminescent device 10 in accordance with the related art, the second passivation layer 43 and barrier film 47 perform the role of a barrier for preventing moisture permeation in the existing face seal structure, for example, in a layer structure with the second passivation layer 43, press sensitive adhesive 45 and barrier film 47, but the press sensitive adhesive 45 performs the role of a barrier in a relatively inefficient manner. As a material issue, the probability of moisture permeation at the lateral surface is higher than that at the upper portion.

When foreign substances or cracks are not generated between each thin films in the face seal structure, moisture permeation does not occur in an abnormal manner, but moisture permeation occurs due to foreign substances or the like that are generated during the process.

In particular, bad step coverage on the first and the second passivation layer 43 forms a boundary surface around foreign substances, which is used as a moisture infiltration path.

Accordingly, moisture ($H_2O$) infiltrated through the press sensitive adhesive 45 having a low barrier capability performs first moisture permeation through the boundary portion of foreign substances, and second moisture permeation is diffused through a lower organic layer of the thin-film transistor, for example, a bank, an interlayer insulating layer (i.e., planarization layer), and the like, thereby oxidizing a cathode electrode of the organic electroluminescent device.

FIG. 4 is an enlarged cross-sectional view schematically illustrating that moisture ($H_2O$) infiltrated through a crack generated when cutting a scribe line of the organic electroluminescent device is propagated through the first and the second passivation layer, as an enlarged cross-sectional view of portion "A" in FIG. 3.

FIG. 5 is a view schematically illustrating a phenomenon in which a crack is propagated through the first and the second passivation layer when cutting a scribe line of the organic electroluminescent device according to the related art using a cutting wheel.

As illustrated in FIGS. 4 and 5, when the scribe line 50 of the organic electroluminescent device is cut using a cutting wheel 60, glass damage due to the wheel scribe may generate a crack by an external shock while being processed or moved during the inspection process or the like, which becomes a path of moisture permeation at the lateral surface while being propagated through the first and the second passivation layer 39, 43.

Furthermore, moisture may be propagated through an organic layer during the generation of a crack of the first and the second passivation layer 39, 43 exposed at an outer portion of the press sensitive adhesive 45 or barrier film 47.

Accordingly, moisture may be infiltrated due to a crack of the first and the second passivation layer 39, 43 initiated from the scribe line 50 in such a manner to form a non-light-emitting region in the display area portion (AA).

In addition, a crack of the first and the second passivation layer 39, 43 may be generated from a panel edge portion due to an external shock or the like and propagated to the light emitting portion, thereby forming a non-light-emitting region in the display area portion (AA).

SUMMARY OF THE INVENTION

The present invention is directed to solving the problems in the related art, and an object of the present invention is to provide a flexible organic electroluminescent device and a method for fabricating the same in which a partition wall pattern surrounding the circumference of the display area is formed in the non-display area to prevent a crack from being propagated, thereby suppressing moisture infiltration in a reliability environment.

In order to accomplish the foregoing object, a flexible organic electroluminescent device according to the present invention may include a substrate defined with a display area including a plurality of pixel regions and a non-display area at the outside thereof; a switching thin film transistor and a drive thin film transistor formed at the each pixel region on the substrate; an interlayer insulating layer formed on the substrate including the switching thin film transistor and drive thin film transistor to expose a drain electrode of the drive thin film transistor; a partition wall pattern formed in the non-display area of the substrate to surround the circumference of the display area; a first electrode formed in each pixel region on the interlayer insulating layer, and connected to the drain electrode of the drive thin film transistor; a bank formed around each pixel region and in the non-display area of the substrate including the first electrode; an organic light emitting layer separately formed for each pixel region on the first electrode; a second electrode formed on an entire surface of the display area including the organic light emitting layer; a first passivation layer formed on an entire surface of the substrate including the second electrode and at an upper portion of the partition wall pattern; an organic layer formed on the first passivation layer of the display area; a second passivation layer formed at an upper portion of the organic layer and on the first passivation layer on an entire surface of the substrate and at an upper portion of the partition wall pattern; a barrier film located to face the substrate; and an adhesive interposed between the substrate and the barrier film to adhere the substrate to the barrier film so as to implement a panel state.

In order to accomplish the foregoing object, a method of fabricating a flexible organic electroluminescent device according to the present invention may include providing a substrate defined with a display area including a plurality of pixel regions and a non-display area at the outside thereof; forming a switching thin film transistor and a drive thin film transistor formed at the each pixel region on the substrate; forming an interlayer insulating layer formed on the substrate including the switching thin film transistor and drive thin film transistor to expose a drain electrode of the drive thin film transistor; forming a partition wall pattern formed in the non-display area of the substrate to surround the circumference of the display area; forming a first electrode formed in each pixel region on the interlayer insulating layer, and connected to the drain electrode of the drive thin film transistor; forming a bank formed around each pixel region and in the non-display area of the substrate including the first electrode; forming an organic light emitting layer separately formed for each pixel region on the first electrode; forming a second electrode formed on an entire surface of the display area including the organic light emitting layer; forming a first passivation layer formed on an entire surface of the substrate including the second electrode and at an upper portion of the partition wall pattern in a separate manner; forming an organic layer formed on the first passivation layer of the display area; forming a second passivation layer formed at an upper portion of the organic layer and on the first passivation layer on an entire surface of the substrate and at an upper portion of the partition wall pattern in a separate manner; and adhering a barrier film located to face the substrate onto the second passivation layer to implement a panel state.

According to a flexible organic electroluminescent device and a method of fabricating the same according to the present invention, a partition wall pattern in an inverse taper shape may be formed in the non-display area which is a panel edge portion of the organic electroluminescent device to surround the circumference of the display area which is a panel portion while separated from an organic layer formed in the display area, such that passivation layers laminated on the partition wall pattern are separated from passivation layers formed on an entire surface of the substrate, to prevent a crack generated on the passivation layer exposed to the outside when cutting a scribe line using a cutting wheel from being propagated into the panel, thereby suppressing moisture infiltration in a reliability environment.

In particular, a passivation layer exposed to the outside of the panel may be separately formed from a passivation layer formed at an upper portion of the partition wall pattern in an inverse taper shape and separated from a passivation layer formed at an inner portion of the panel, and thus a crack generated by an external shock may be blocked from being propagated into the panel due to the separated passivation layer, thereby suppressing moisture infiltration in a reliability environment.

Furthermore, according to a flexible organic electroluminescent device and a method of fabricating the same according to the present invention, a partition wall pattern in an inverse taper shape may be formed using layers with different etch rates such that a passivation layer formed at an upper portion of the partition wall pattern is separated from a passivation layer formed at a lateral wall of the partition wall pattern in an inverse taper shape, and thus a crack generated by an external shock may be blocked from being propagated into the panel due to the separated passivation layer, thereby suppressing moisture infiltration in a reliability environment.

Accordingly, according to a flexible organic electroluminescent device and a method of fabricating the same according to the present invention, crack propagation may be prevented during the occurrence of moisture permeation because a force may be exerted to a minute crack due to a scribe while performing the subsequent process to propagate and transmit the crack from the most outside edge to the display area, thereby reducing reliability failure.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 10A through 10L are fabrication process cross-sectional views illustrating an organic electroluminescent device according to the present invention.

DETAILED DESCRIPTION OF THE ILLUSTRATED

Hereinafter, an organic electroluminescent device according to a preferred embodiment of the present invention will be described below with reference to the accompanying drawings.

Figure 1:
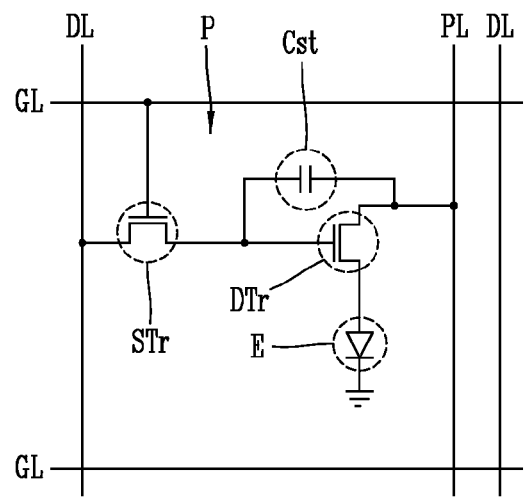
FIG. 1 is a circuit diagram for one pixel region in a related art active matrix type organic electroluminescent device.
Figure 2:
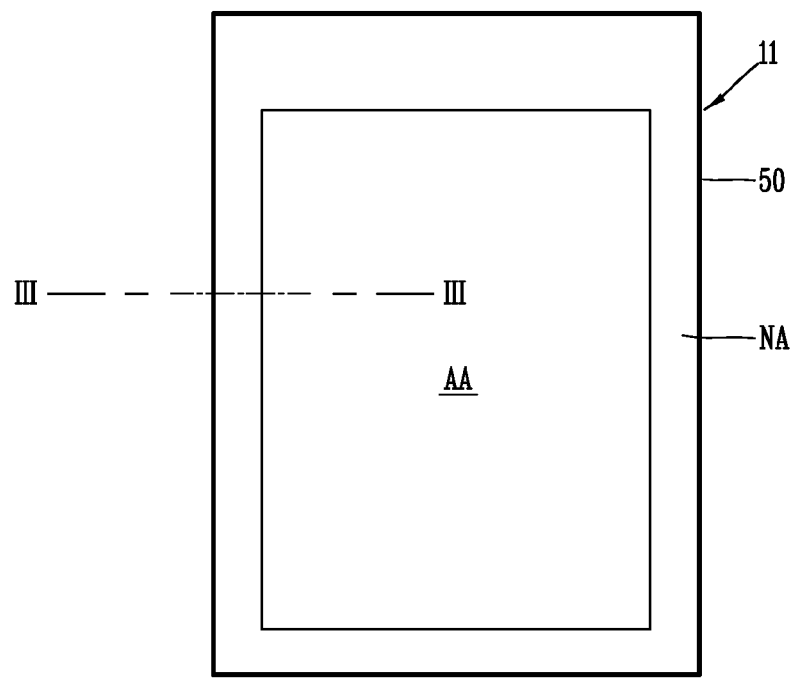
FIG. 2 is a plan view schematically illustrating an organic electroluminescent device according to the related art.
Figure 3:
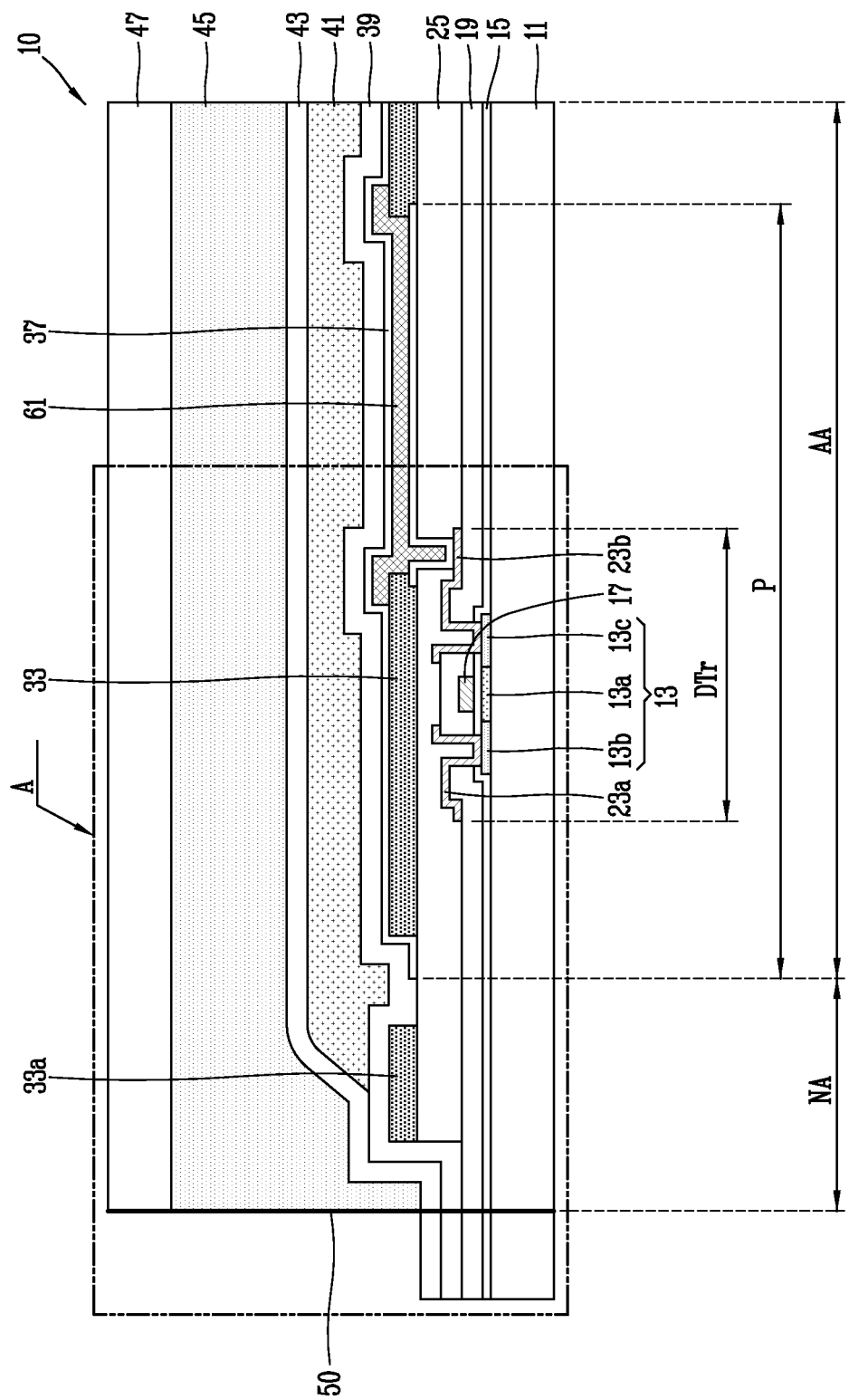
FIG. 3 is a schematic cross-sectional view of an organic electroluminescent device according to the related art, as a cross-sectional view along line III-III in FIG. 2.
Figure 4:
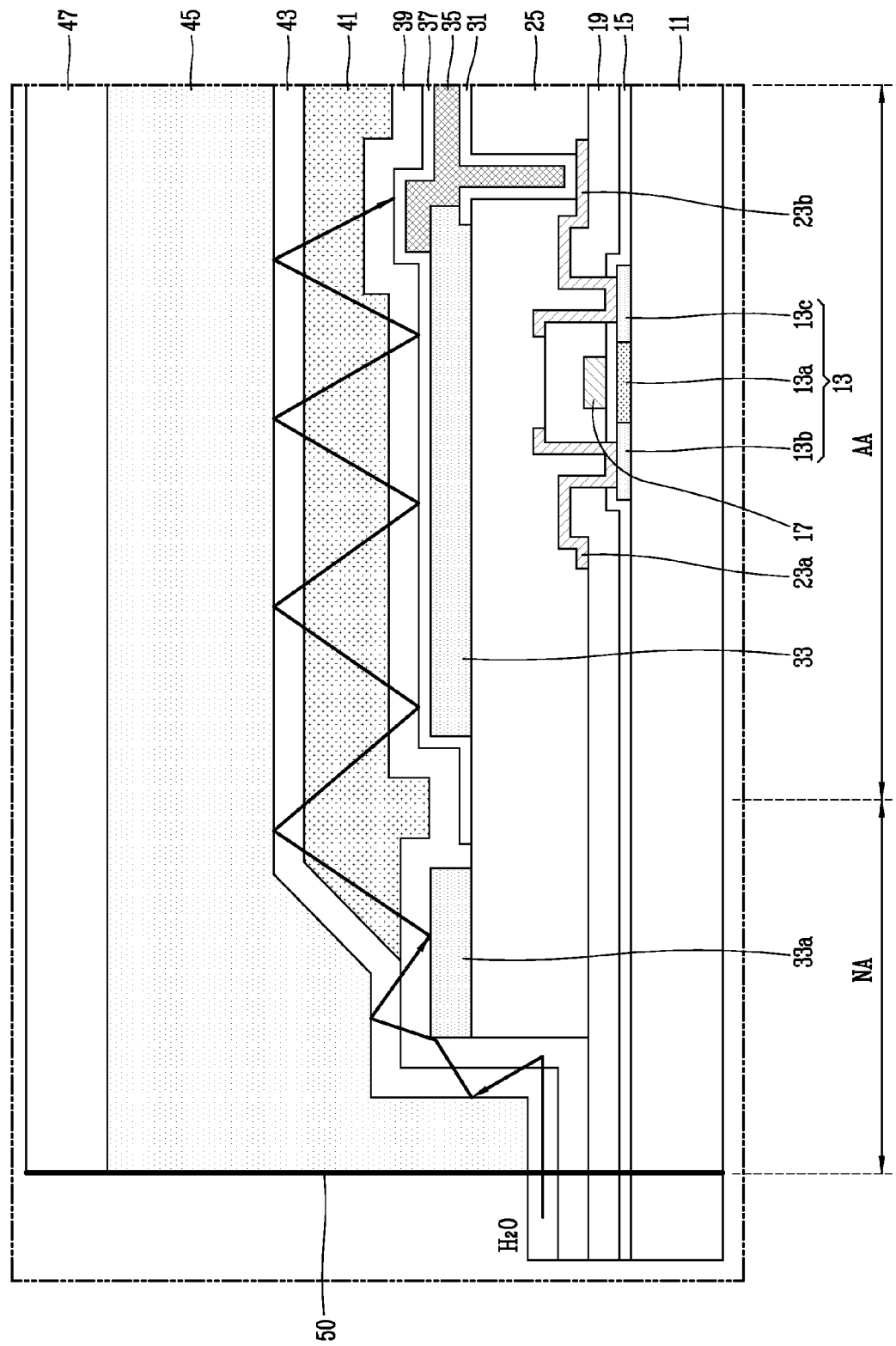
FIG. 4 is an enlarged cross-sectional view schematically illustrating moisture ($H_2O$) infiltrated through a crack generated when cutting a scribe line of the organic electroluminescent device according to the related art is propagated through the first and the second passivation layer, as an enlarged cross-sectional view of portion "A" in FIG. 3.
Figure 5:
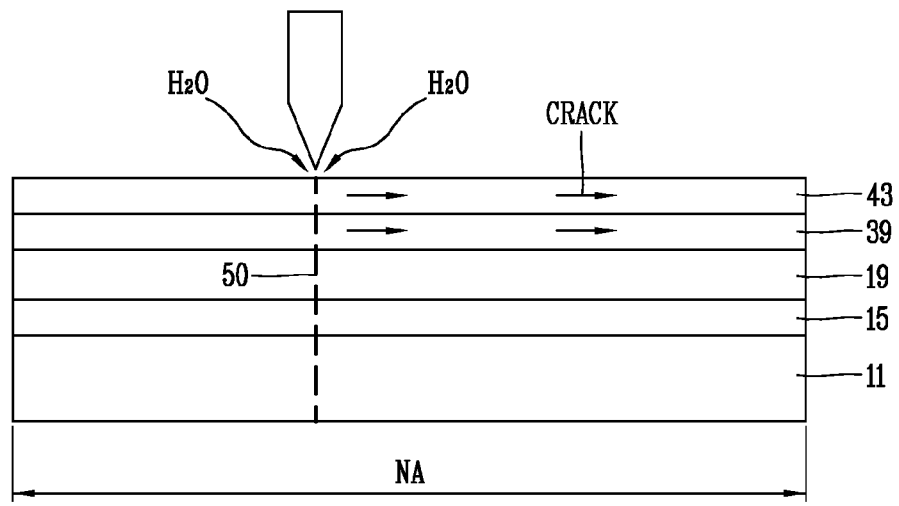
FIG. 5 is a view schematically illustrating a phenomenon in which a crack is propagated through the first and the second passivation layer when cutting a scribe line of the organic electroluminescent device according to the related art using a cutting wheel.
Figure 6:
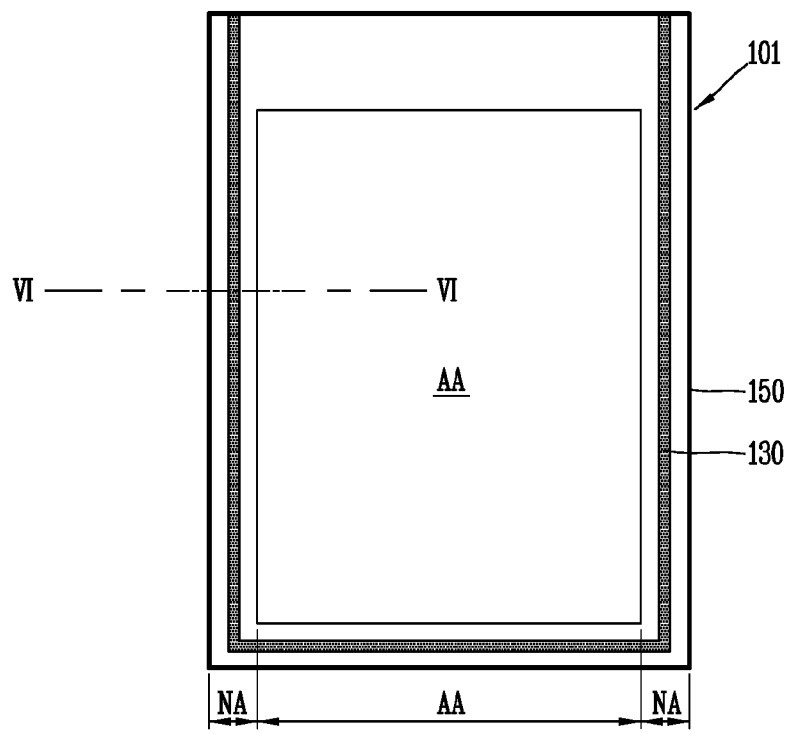
FIG. 6 is a plan view schematically illustrating an organic electroluminescent device according to the present invention.

FIG. 6 is a plan view schematically illustrating an organic electroluminescent device according to the present invention.

Figure 7:
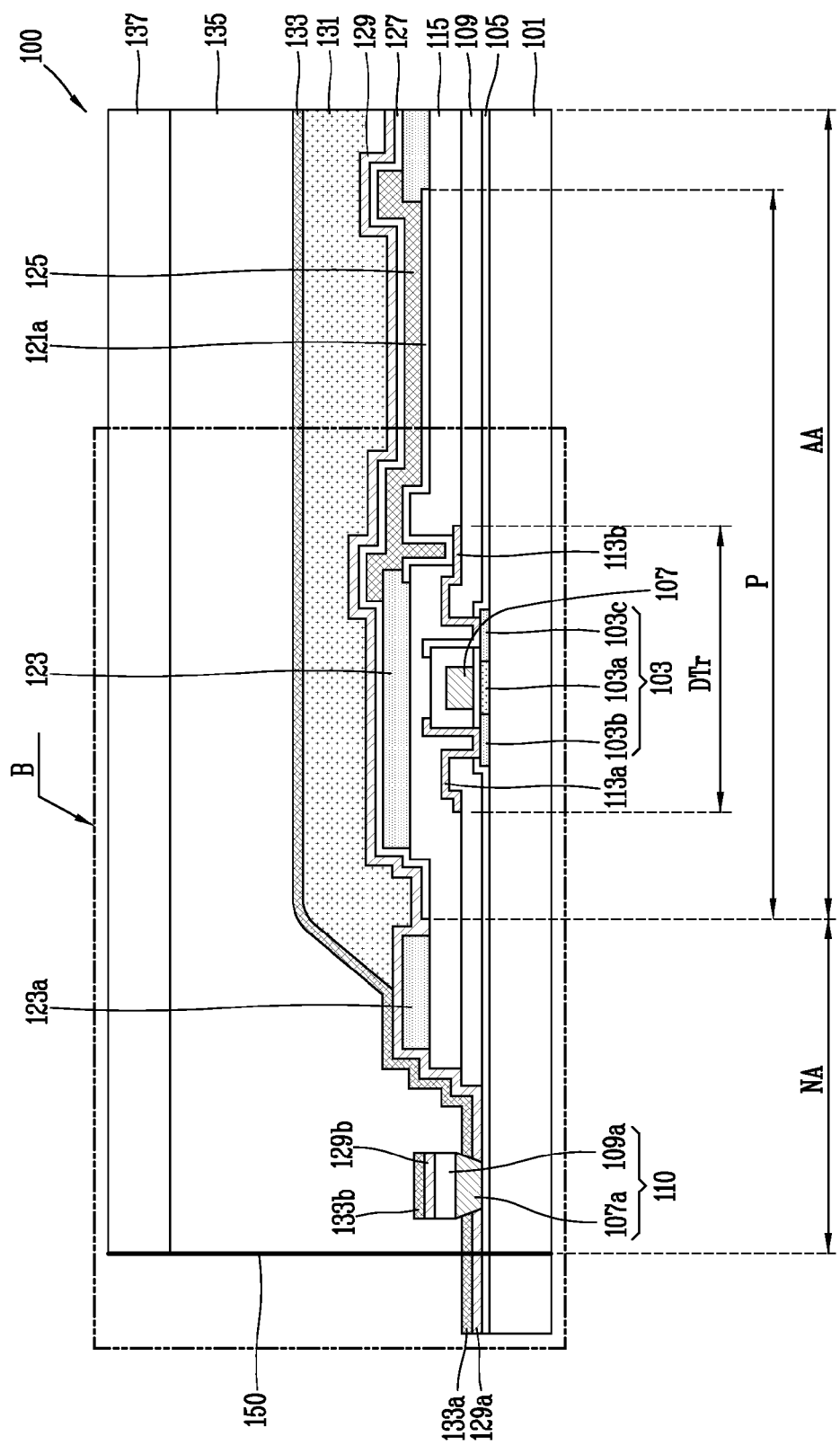
FIG. 7 is a schematic cross-sectional view of an organic electroluminescent device according to the present invention, as a cross-sectional view along line VII-VII in FIG. 6.

FIG. 7 is a schematic cross-sectional view of an organic electroluminescent device according to the present invention, as a cross-sectional view along line VII-VII in FIG. 6.

Figure 8:
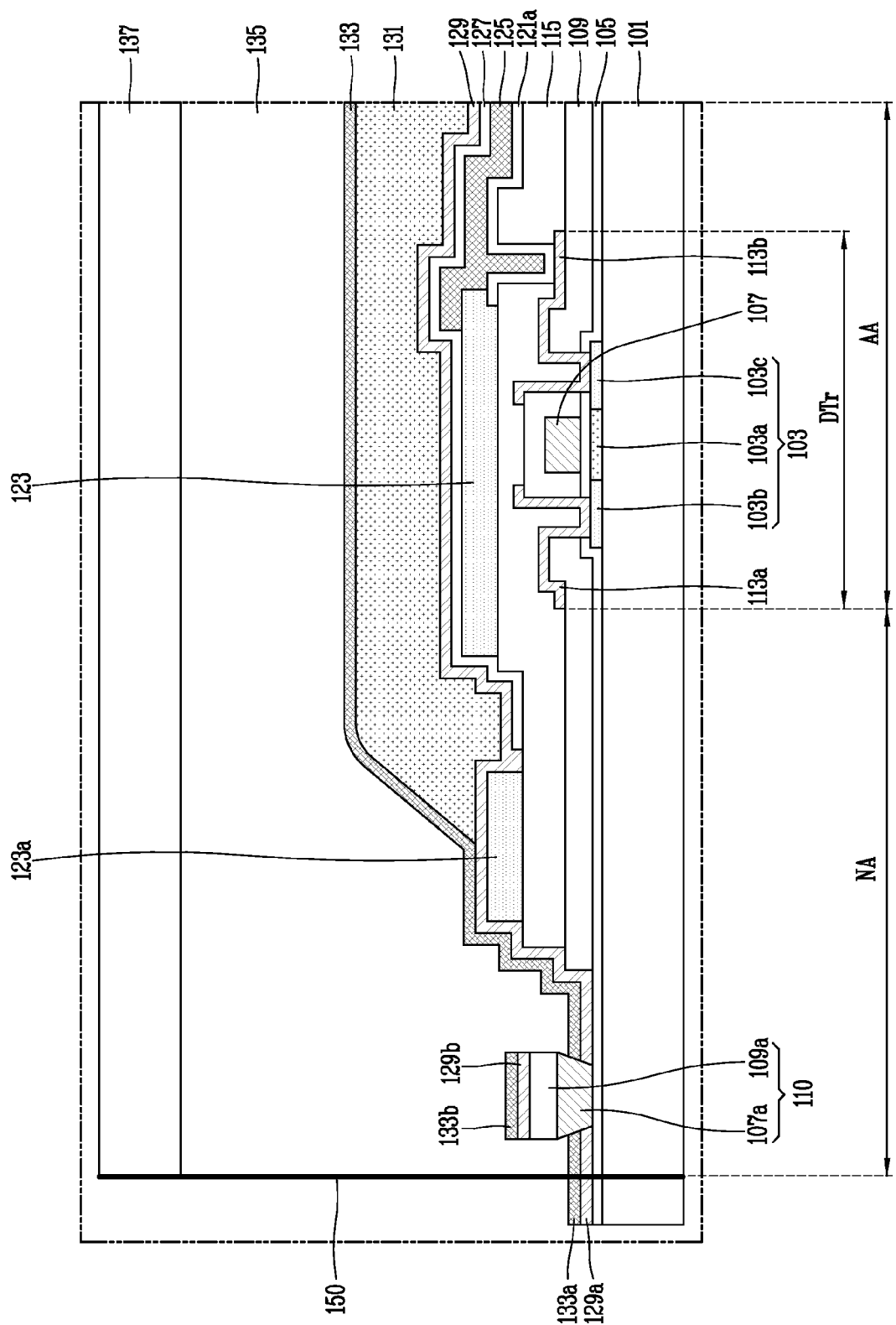
FIG. 8 is an enlarged cross-sectional view schematically illustrating moisture ($H_2O$) infiltrated through a crack generated when cutting a scribe line of the organic electroluminescent device according to the present invention is blocked by a separated passivation layer at an upper portion of the partition wall pattern, as an enlarged cross-sectional view of portion "B" in FIG. 7.

FIG. 8 is an enlarged cross-sectional view schematically illustrating that moisture (H2O) infiltrated through a crack generated when cutting a scribe line of the organic electroluminescent device according to the present invention is blocked by a separated passivation layer at an upper portion of the partition wall pattern, as an enlarged cross-sectional view of portion "B" in FIG. 7.

A flexible organic electroluminescent device according to the present invention is divided into a top emission type and a bottom emission type according to the transmission direction of emitted light, and hereinafter, according to the present invention, the top emission type will be described as an example.

Referring to FIGS. 6 through 8, in a flexible organic electroluminescent device 100 according to the present invention, a substrate 101 formed with the drive thin film transistor (DTr) and the organic light emitting diodes (E) is encapsulated by a barrier film 137.

Specifically describing the flexible organic electroluminescent device according to the present invention, as illustrated in FIGS. 6 through 8, a display area (AA) is defined on a substrate 101 having a flexible characteristic, and a non-display area (NA) is defined at the outside of the display area (AA), and a plurality of pixel regions (P), each defined as a region surrounded by the gate line (not shown) and the data line (not shown) are provided, and the power line (not shown) is provided in parallel to the data line (not shown) in the display area (AA).

Here, the flexible substrate 101 is made of a flexible glass substrate or plastic material having a flexible characteristic to maintain display performance as it is even when the flexible organic electroluminescent device (OLED) is bent like a paper.

Furthermore, a buffer layer (not shown) made of an insulation material, silicon oxide ($SiO_2$) or silicon nitride ($NiNx$), which is an inorganic insulation material, is provided on the substrate 101. Here, the buffer layer (not shown) is formed at a lower portion of the semiconductor layer 103 formed during the subsequent process to prevent the characteristics of the semiconductor layer 103 from being deteriorated due to the emission of alkali ions coming out of an inner portion of the substrate 101 during the crystallization of the semiconductor layer 103.

Furthermore, a semiconductor layer 103 made of pure polysilicon to correspond to the drive region (not shown) and switching region (not shown), respectively, and comprised of a first region 103a forming a channel at the central portion thereof and second regions 103b, 103c in which a high concentration of impurities are doped at both lateral surfaces of the first region 103a is formed at each pixel region (P) within the display area (AA) at an upper portion of the buffer layer (not shown).

A gate insulating layer 105 is formed on the buffer layer (not shown) including the semiconductor layer 103, and a gate electrode 107 is formed to correspond to the first region 103a of each of the semiconductor layer 103 in the drive region (not shown) and switching region (not shown) on the gate insulating layer 105.

Furthermore, a gate line (not shown) connected to a gate electrode (not shown) formed in the switching region (not shown) and extended in one direction is formed on the gate insulating layer 105. Here, the gate electrode 107 and the gate line (not shown) may have a single layer structure which is made of a first metal material having a low resistance characteristic, for example, any one of aluminium (Al), aluminium alloy (AlNd), copper (Cu), copper alloy, molybdenum (Mo), and molytitanium (MoTi), or may have a double layer or triple layer structure which is made of two or more of the first metal materials. According to the drawing, it is illustrated that the gate electrode 107 and gate line (not shown) have a single layer structure.

On the other hand, an insulating layer 109, which is made of an insulation material, for example, silicon oxide ($SiO_2$) or silicon nitride (NiNx), which is an inorganic insulation material, is formed on an entire surface of the display area of the substrate including the gate electrode 107 and gate line (not shown). Here, a semiconductor layer contact hole (not shown) for exposing the second regions 103b, 103c, respectively, located at both lateral surfaces of the first region 103a of each of the semiconductor layer, is provided on the insulating layer 109 and the gate insulating layer 105 at a lower portion thereof.

A data line (not shown) crossed with a gate line (not shown) to define the pixel region (P) and made of a second metal material, for example, any one or two or more of aluminium (Al), aluminium alloy (AlNd), copper (Cu), copper alloy, molybdenum (Mo), molytitanium (MoTi), chromium (Cr), and titanium (Ti), and a power line (not shown) separated therefrom are formed at an upper portion of the insulating layer 109 including the semiconductor layer contact hole (not shown). Here, the power line (not shown) may be formed to be separated from and in parallel to the gate line (not shown) on a layer formed with the gate line (not shown), namely, the gate insulating layer 105.

Figure 9:
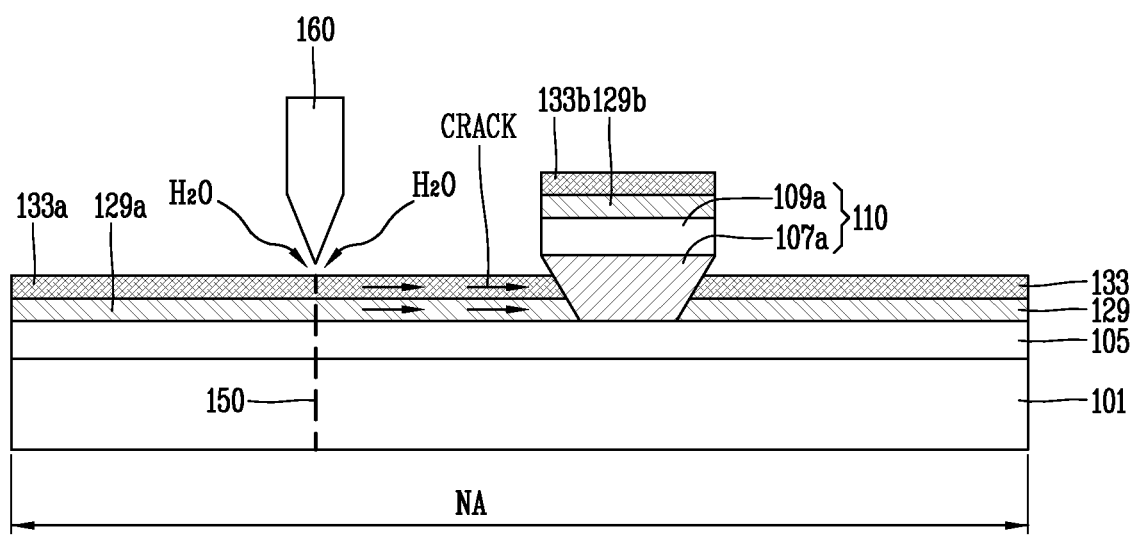
FIG. 9 is a view schematically illustrating a phenomenon in which a crack is not propagated by a separated passivation layer at an upper portion of the partition wall pattern when cutting a scribe line of the organic electroluminescent device according to the related art using a cutting wheel.

FIG. 9 is a view schematically illustrating a phenomenon in which a crack is not propagated by a separated passivation layer at an upper portion of the partition wall pattern when cutting a scribe line of the organic electroluminescent device according to the related art using a cutting wheel.

As illustrated in FIG. 9, a partition wall pattern 110 surrounding the circumference of the display area is formed in the non-display area of the substrate 101. Here, the partition wall pattern 110 is formed with the layer structure of a metal pattern 107a in an inverse taper shape and an insulating layer 109a in a vertical cross-sectional shape. The metal pattern 107a is formed with the same metal layer as that of the gate electrode 107, and the insulating pattern 109a is formed with the same insulating layer as that of the insulating layer 109, and the metal layer has a characteristic with a faster etch rate compared to the insulation material layer. Furthermore, though it is described a case where the partition wall pattern 110 is formed with the layer structure of a metal pattern 107a made of the same metal layer as that of the gate electrode 107 and an insulating pattern 109a made of the same layer as that of the insulating layer 109 as an example in the present invention, it may not be limited to this, and it may be formed with the layer structure of a metal layer for the formation of a source electrode and a drain electrode and an interlayer insulating layer 115 formed thereon.

On the other hand, when the partition wall pattern 110 uses a lower layer having a faster etch rate than that of an upper layer, any material may be used for the upper and the lower layer, respectively. It is for the purpose that a portion formed at an upper portion of the partition wall pattern 110 and a portion formed at a lower portion of the partition wall pattern 110 are separately formed for the first and the second passivation layer 129, 133 formed in the subsequent process. In other words, part of the first and the second passivation layer 129, 133 is separately formed from another part of the first and the second passivation layer 129, 133 formed at an upper portion of the partition wall pattern 110 while being formed at an inner side of the lateral surface portion of the metal pattern 107a constituting the partition wall pattern 110 in an inverse taper shape.

Accordingly, even though a crack is generated at part of the first and the second passivation layer 129a, 133a in the non-display area by an external shock, since part of the first and the second passivation layer 129b, 133b formed on the partition wall pattern 110 is separated apart from the part of the first and the second passivation layer 129a, 133a, a crack generated at the part of the first and the second passivation layer 129a, 133a by an external shock is not propagated into the display area.

In addition, as illustrated in FIGS. 7 and 8, a source electrode 113a and a drain electrode 113b brought into contact with the second regions 103b, 103c separated from each other, and respectively exposed through the semiconductor layer contact hole (not shown) and formed of the same second metal material as that of the data line (not shown) are formed in the each drive region (not shown) and switching region (not shown) on the insulating layer 109. Here, the semiconductor layer 103 and gate insulating layer 105 sequentially deposited on the drive region (not shown) and the gate electrode 107 and insulating layer 109 and the source electrode 113a and drain electrode 113b formed to be separated from each other forms a drive thin film transistor (DTr).

On the other hand, though it is shown in the drawing that all the data line (not shown) and source electrode 113a and drain electrode 113b have a single layer structure as an example, the constituent elements may have a double layer or triple layer structure.

Here, though not shown in the drawing, a switching thin film transistor (not shown) having the same layer structure as that of the drive thin film transistor (DTr) is also formed in the switching region (not shown). Here, the switching thin film transistor (not shown) is electrically connected to the drive thin film transistor (DTr), the gate line (not shown) and data line (not shown). In other words, the gate line (not shown) and data line (not shown) are connected to a gate electrode (not shown) and a source electrode (not shown), respectively, of the switching thin film transistor (not shown), and the drain electrode (not shown) of the switching thin film transistor (not shown) is electrically connected to the gate electrode 107 of the drive thin film transistor (DTr).

On the other hand, according to the substrate 101 for an organic electroluminescent device in accordance with the present invention, it is shown that the drive thin film transistor (DTr) and switching thin film transistor (not shown) have a semiconductor layer 103 with polysilicon, and configured with a top gate type as an example, but it should be understood by those skilled in the art that the drive thin film transistor (DTr) and switching thin film transistor (not shown) can be also configured with a bottom gate type having a semiconductor layer with amorphous silicon.

When the drive thin film transistor (DTr) and switching thin film transistor (not shown, STr) are configured with a bottom gate type, the layer structure includes a gate electrode, a gate insulating layer, an active layer with pure amorphous silicon, semiconductor layers separated from each other and made of an ohmic contact layer having amorphous silicon doped with impurities, and a source electrode and a drain electrode separated from each other. Here, it has a characteristic that the gate line is formed to be connected to the gate electrode of the switching thin film transistor on a layer formed with the gate electrode, and the data line is formed to be connected to the source electrode on a layer formed with the source electrode of the switching thin film transistor.

On the other hand, an interlayer insulating layer 115 having a drain contact hole (not shown) for exposing the drain electrode 113b of the drive thin film transistor (DTr) is formed on the drive thin film transistor (DTr) and switching thin film transistor (not shown). Here, an insulation material, for example, silicon oxide ($SiO_2$) or silicon nitride (NiNx), which is an inorganic insulation material, is used for the interlayer insulating layer 115.

Furthermore, a first electrode 121a brought into contact with the drain electrode 113c of the drive thin film transistor (DTr) through the drain contact hole (not shown) and having a separated form for each pixel region (P) is formed on the interlayer insulating layer 115.

In addition, banks 123, 123a made of an insulation material, particularly, for example, benzo-cyclo-butene (BCB), polyimide or photo acryl are formed in the boundary and non-display area (NA) of each pixel region (P) on the first electrode 121a. Here, the bank 123 is formed to be overlapped with the edge of the first electrode 121a in the form of surrounding the each pixel region (P), and forms a lattice shape having a plurality of opening portions as a whole in the display area (AA). Furthermore, the bank 123a is formed in the non-display area, which is a panel edge portion.

On the other hand, an organic light emitting layer 125 comprised of organic light emitting patterns (not shown) for emitting red, green and blue colors, respectively, is formed on the first electrode 121a within each of the pixel region (P) surrounded by the banks 123, 123a. The organic light emitting layer 125 may be configured with a single layer made of an organic light emitting material, and otherwise, though not shown in the drawing, may be configured with a multiple layer with a hole injection layer, a hole transporting layer, an emitting material layer, an electron transporting layer, and an electron injection layer.

Furthermore, a second electrode 127 is formed on an entire surface of the display area (AA) at an upper portion of the organic light emitting layer 125 and the banks 123, 123a. Here, the first electrode 121a and second electrode 127 and the organic light emitting layer 125 interposed between the two electrodes 121a, 127 form an organic light emitting diode (E).

Accordingly, for the organic light emitting diode (E), when a predetermined voltage is applied to the first electrode 121a and second electrode 127 according to the selected color signal, holes injected from the first electrode 121a and electrons provided from the second electrode 127 is transported to the organic light emitting layer 125 to form excitons, and light is generated and emitted in a visible light form when the excitons is transitioned from the excited state to the ground state. At this time, the emitted light is exited to the outside through the transparent second electrode 127, and thus the flexible organic electroluminescent device implements any image.

On the other hand, a first passivation layer 129 made of an insulation material, particularly, silicon oxide ($SiO_2$) or silicon nitride (NiNx), which is an inorganic insulation material, is formed on an entire surface of the substrate including the second electrode 127. Here, moisture infiltration to the organic light emitting layer 125 cannot be completely suppressed by only the second electrode 127, and thus the first passivation layer 129 is formed on the second electrode 127 to completely suppress moisture infiltration to the organic light emitting layer 125.

Furthermore, as illustrated in FIGS. 8 and 9, part of the first passivation layer 129, for example, a first portion 129a, is formed on the lateral surface of the partition wall pattern 130 in an inverse taper shape and the non-display area (NA), and a second portion 129b is formed only at an upper portion of the partition wall pattern 130. Here, the first portion 129a and second portion 129b are separately formed from each other. The partition wall pattern 130 is formed with a metal pattern 107a in an inverse taper shape and an insulating pattern 109a in a vertical cross-sectional shape.

Accordingly, the first portion 129a of the first passivation layer 129 is formed at a lateral surface of the metal pattern 107a of the partition wall pattern 130, and the second portion 129b is formed at an upper portion of the insulating pattern 109a of the partition wall pattern 130. It enables the separation between the first portion 129a and second portion 129b of the first passivation layer 129 since part of the first passivation layer 129 is formed at an inner side of the lateral surface of the metal pattern 107a in an inverse taper shape constituting the partition wall pattern 110 but not formed at a lateral surface of the insulating pattern 109a.

Furthermore, an organic layer 131 made of a high organic molecular substance such as a polymer is formed in the display area (AA) on the first passivation layer 129. Here, olefin polymers (polyethylene, polypropylene), polyethylene terephthalate (PET), epoxy resin, fluororesin, polysiloxane, and the like may be used for a high molecular layer constituting the organic layer 131.

In addition, a second passivation layer 133 made of an insulation material, for example, silicon oxide ($SiO_2$) or silicon nitride (NiNx), which is an inorganic insulation material, is additionally formed on an entire surface of the substrate 101 including the organic layer 131 and first passivation layer 129, 129a, 129b to block moisture from being infiltrated through the organic layer 131. Here, part of the second passivation layer 133, for example, a first portion 133a, is formed on a lateral surface portion of the partition wall pattern 130 in an inverse taper shape and a first portion 129a of the first passivation layer on the non-display area (NA), and a second portion 133b is formed only on a second portion 129b of the first passivation layer at an upper portion of the partition wall pattern 130. Here, the first portion 133a and second portion 133b of the second passivation layer are formed to be separated from each other similarly to the first portion 129a and second portion 129b of the first passivation layer.

Accordingly, as illustrated in FIG. 9, the first portion 129a, 133a of the first and the second passivation layer 129, 133 is formed at a lateral surface portion of the metal pattern 107a of the partition wall pattern 130, and the second portion 129b, 133b is formed at an upper portion of the insulating pattern 109a of the partition wall pattern 130. It enables the separation between the first portion 129a, 133a and second portion 129b, 133b of the first and the second passivation layer 129, 133 since part of the first and the second passivation layer 129, 133 is formed at an inner side of the lateral surface of the metal pattern 107a in an inverse taper shape constituting the partition wall pattern 110 but not formed at a lateral surface of the insulating pattern 109a.

As illustrated in FIGS. 7 and 8, though not shown in the drawing, an adhesive is located on an entire surface of the substrate including the second passivation layer 133 to face a barrier film 137 for the encapsulation of the organic light emitting diode (E), and the adhesive 135 made of any one of a frit having a transparent adhesive characteristic, an organic insulation material, and a high molecular substance is completely glued to the substrate 101 and barrier film 137 with no air layer and interposed between the substrate 101 and barrier film 137. Here, according to the present invention, a case of using a press sensitive adhesive (PSA) for the adhesive (not shown) will be described as an example.

In this manner, the substrate 101 is fixed to the barrier film 137 through the adhesive 135 to form a panel state, thereby configuring an organic electroluminescent device according to the present invention.

Accordingly, in a flexible organic electroluminescent device 100 according to the present invention, the partition wall pattern 130 in an inverse taper shape may be formed in the non-display area which is a panel edge portion of the organic electroluminescent device to surround the circumference of the display area which is a panel portion while separated from an organic layer formed in the display area, such that the second portions 129b, 133b of the passivation layers laminated on the partition wall pattern 130 are separated from the first and the second passivation layer 129, 133 formed on an entire surface of the substrate, to prevent a crack generated on the first and the second passivation layer 129, 133 exposed to the outside when cutting a scribe line 150 using a cutting wheel 160 from being propagated into the panel as illustrated in FIG. 9, thereby suppressing moisture infiltration in a reliability environment.

In particular, the first portions 129a, 133a of the first and the second passivation layer exposed to the outside of the panel may be separately formed from the second portions 129b, 133b of the first and the second passivation layer formed at an upper portion of the partition wall pattern 130 in an inverse taper shape and separated from the first and the second passivation layer 129, 133 formed at an inner portion of the panel, and thus a crack generated by an external shock may be blocked from being propagated into the panel due to the separated first and the second passivation layer 129, 133, thereby suppressing moisture infiltration in a reliability environment.

A method of fabricating a flexible organic electroluminescent device according to the present invention will be described below with reference to FIGS. 10A through 10L.

FIGS. 10A through 10L are process cross-sectional views schematically illustrating a method of fabricating a flexible organic electroluminescent device according to the present invention.

As illustrated in FIG. 10A, a substrate 101 having a flexible characteristic defined with a display area (AA) and a non-display area (NA) at the outside of the display area (AA) is prepared. Here, the flexible substrate 101 is made of a flexible glass substrate or plastic material having a flexible characteristic to maintain display performance as it is even when the flexible organic electroluminescent device (OLED) is bent like a paper.

Next, a buffer layer (not shown) made of an insulation material, for example, silicon oxide ($SiO_2$) or silicon nitride (NiNx), which is an inorganic insulation material, is formed on the substrate 101. Here, the buffer layer (not shown) is formed at a lower portion of the semiconductor layer 103 formed during the subsequent process to prevent the characteristics of the semiconductor layer 103 from being deteriorated due to the emission of alkali ions coming out of an inner portion of the substrate 101 during the crystallization of the semiconductor layer 103.

Subsequently, a semiconductor layer 103 made of pure polysilicon to correspond to the drive region (not shown) and switching region (not shown), respectively, and comprised of a first region 103a forming a channel at the central portion thereof and second regions 103b, 103c in which a high concentration of impurities are doped at both lateral surfaces of the first region 103a is formed at each pixel region (P) within the display area (AA) at an upper portion of the buffer layer (not shown).

Next, as illustrated in FIG. 10B, a gate insulating layer 105 is formed on the buffer layer (not shown) including the semiconductor layer 103, and a gate electrode 107 is formed to correspond to the first region 103a of each of the semiconductor layer 103 in the drive region (not shown) and switching region (not shown) on the gate insulating layer 105. Here, a gate line (not shown) connected to a gate electrode 107 formed in the switching region (not shown) and extended in one direction is formed on the gate insulating layer 105, and a metal pattern 107a constituting a partition wall pattern (not shown, refer to reference numeral 110 in FIG. 10D) is formed in the non-display area (NA). Here, the gate electrode 107, gate line (not shown) and metal pattern 107a may have a single layer structure which is made of a first metal material having a low resistance characteristic, for example, any one of aluminium (Al), aluminium alloy (AlNd), copper (Cu), copper alloy, molybdenum (Mo), and molytitanium (MoTi), or may have a double layer or triple layer structure which is made of two or more of the first metal materials. According to the drawing, it is illustrated as an example that the gate electrode 107 and gate line (not shown) have a single layer structure.

Figure 10C:
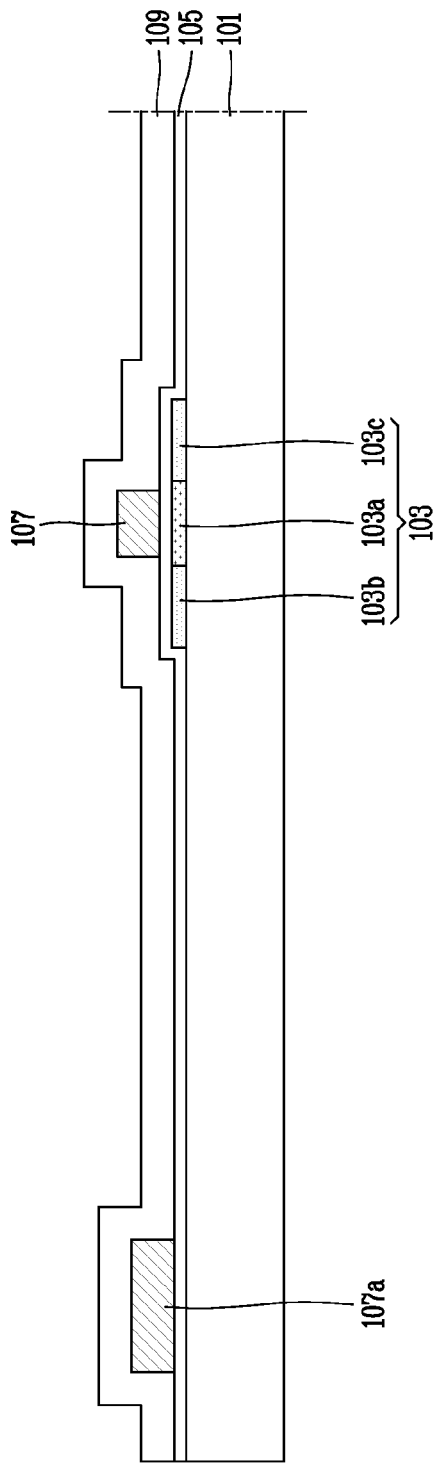

Next, as illustrated in FIG. 10C, an insulating layer 109, which is made of an insulation material, for example, silicon oxide ($SiO_2$) or silicon nitride (NiNx), which is an inorganic insulation material, is formed on an entire surface of the substrate including the gate electrode 107, gate line (not shown) and metal pattern 107a.

Figure 10D:
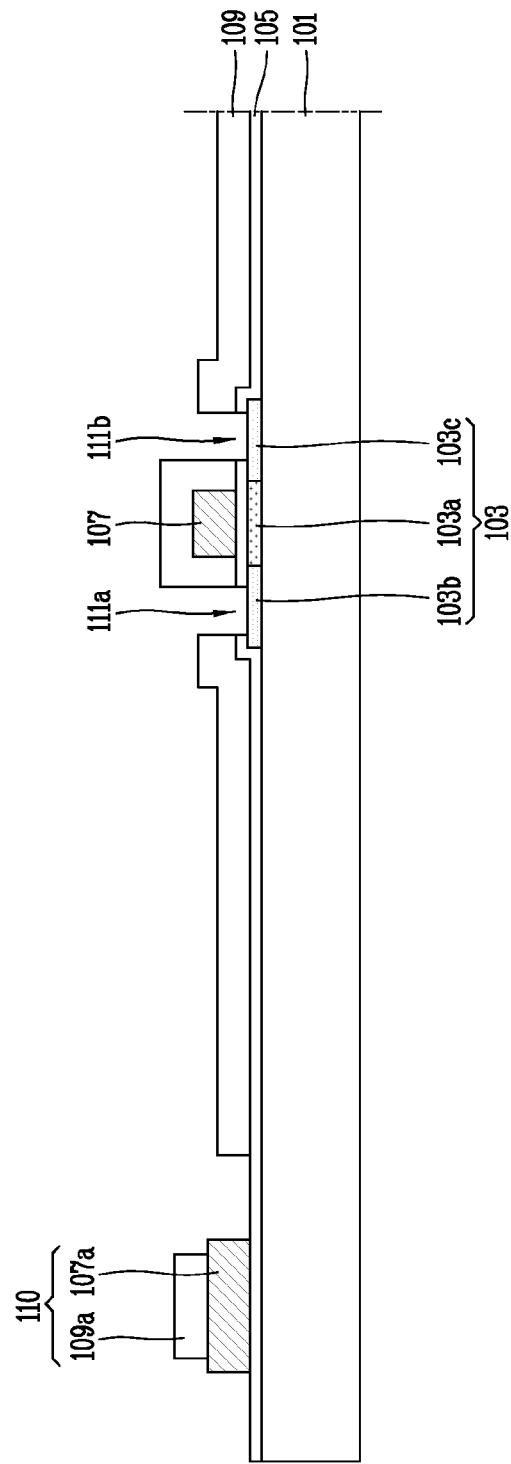
Figure 10K:
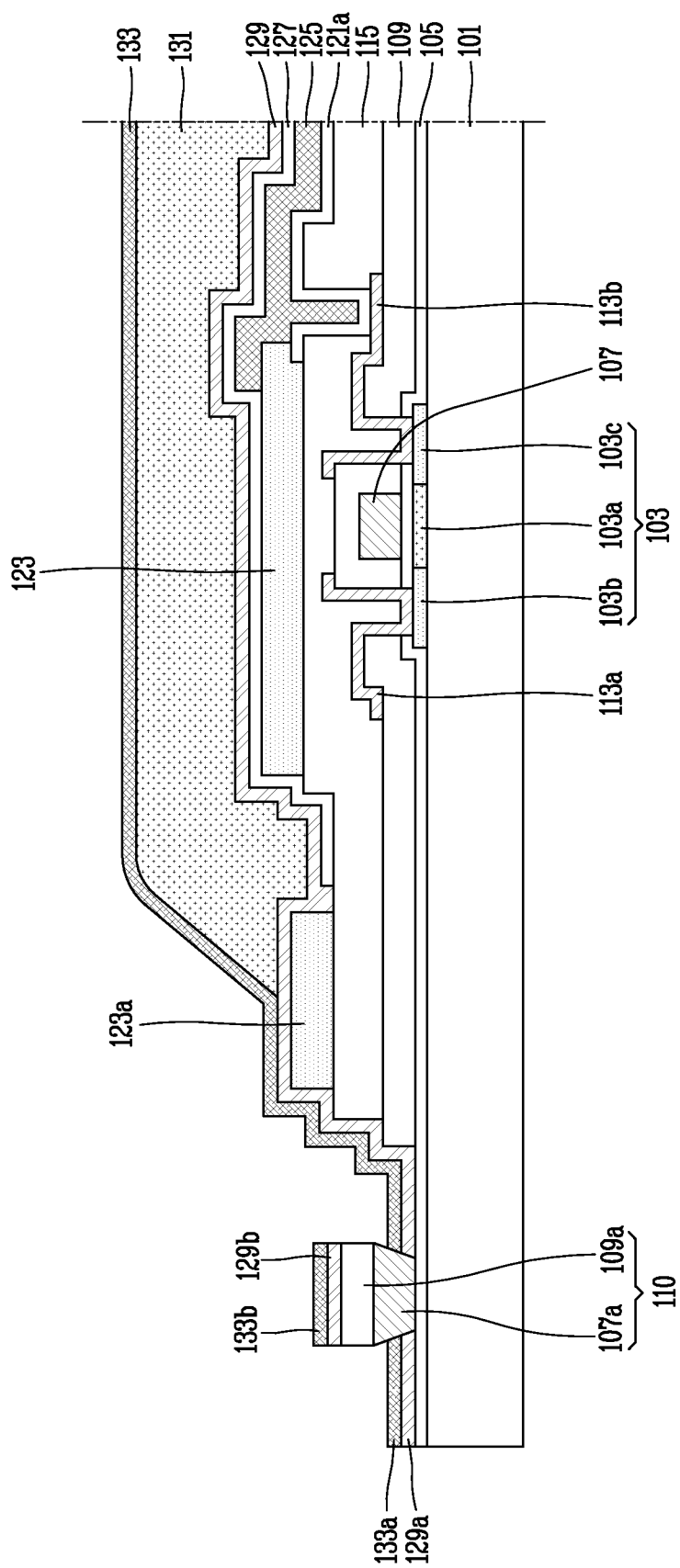

Subsequently, as illustrated in FIG. 10D, the insulating layer 109 and the gate insulating layer 105 at a lower portion thereof are selectively patterned to form a semiconductor layer contact hole 111a, 111b for exposing the second regions 103b, 103c, respectively, located at both lateral surfaces of the first region 103a of each of the semiconductor layer. Here, the insulating layer 109a is formed at the same time during the formation of the semiconductor layer contact hole 111a, 111b. The layer structure of the metal pattern 107a and insulating layer 109a forms a partition wall pattern 110. Here, the width of the insulating layer 109a is formed to be less than that of the metal pattern 107a.

Next, as illustrated in FIG. 10E, a second metal material layer 113 crossed with a gate line (not shown) to define the pixel region (P) is formed at an upper portion of the insulating layer 109 and insulating layer 109a including the semiconductor layer contact hole 111a, 111b. Here, the second metal material layer 113 is made of any one or two or more of aluminium (Al), aluminium alloy (AlNd), copper (Cu), copper alloy, molybdenum (Mo), molytitanium (MoTi), chromium (Cr), and titanium (Ti).

Subsequently, the second metal material layer 113 is selectively patterned to form a data line (not shown) crossed with the gate line (not shown) to define the pixel region (P), and a power line (not shown) separated therefrom. Here, the power line (not shown) may be formed to be separated from and in parallel to the gate line (not shown) on a layer formed with the gate line (not shown), namely, the gate insulating layer.

In addition, as illustrated in FIG. 10F, during the formation of the data line (not shown), a source electrode 113a and a drain electrode 113b brought into contact with the second regions 103b, 103c separated from each other, and respectively exposed through the semiconductor layer contact hole 111a, 111b and formed of the same second metal material as that of the data line (not shown) are formed at the same time in the each drive region (not shown) and switching region (not shown) on the insulating layer 109. Here, the semiconductor layer 103 and gate insulating layer 105 sequentially deposited on the drive region (not shown) and the gate electrode 107 and insulating layer 109 and the source electrode 113a and drain electrode 113b formed to be separated from each other form a drive thin film transistor (not shown, DTr).

Furthermore, during the etching of the second metal material layer 113, a lateral surface of the metal pattern 107a is wet-etched at the same time to form a lateral surface in an inverse taper shape. It is possible because the etch rate of the metal pattern 107a is faster than that of the insulating layer 109a.

On the other hand, though it is shown in the drawing that all the data line (not shown) and source electrode 113a and drain electrode 113b have a single layer structure as an example, the constituent elements may have a double layer or triple layer structure.

Here, though not shown in the drawing, a switching thin film transistor (not shown) having the same layer structure as that of the drive thin film transistor (DTr) is also formed in the switching region (not shown). Here, the switching thin film transistor (not shown) is electrically connected to the drive thin film transistor (DTr), the gate line (not shown) and data line (not shown). In other words, the gate line and data line (not shown) are connected to a gate electrode (not shown) and a source electrode (not shown), respectively, of the switching thin film transistor (not shown), and the drain electrode (not shown) of the switching thin film transistor (not shown) is electrically connected to the gate electrode 107 of the drive thin film transistor (DTr).

On the other hand, according to the substrate 101 for an organic electroluminescent device in accordance with the present invention, it is shown that the drive thin film transistor (DTr) and switching thin film transistor (not shown) have a semiconductor layer 103 with polysilicon, and configured with a top gate type as an example, but it should be understood by those skilled in the art that the drive thin film transistor (DTr) and switching thin film transistor (not shown) can be also configured with a bottom gate type having a semiconductor layer with amorphous silicon.

When the drive thin film transistor (not shown, DTr) and switching thin film transistor (not shown, STr) are configured with a bottom gate type, the layer structure includes a gate electrode, a gate insulating layer, an active layer with pure amorphous silicon, semiconductor layers separated from each other and made of an ohmic contact layer having amorphous silicon doped with impurities, and a source electrode and a drain electrode separated from each other. Here, the gate line is formed to be connected to the gate electrode of the switching thin film transistor on a layer formed with the gate electrode, and the data line is formed to be connected to the source electrode on a layer formed with the source electrode of the switching thin film transistor.

Next, as illustrated in FIG. 10G, an interlayer insulating layer 115 is deposited on the drive thin film transistor (DTr) and switching thin film transistor (not shown). Here, an insulation material, for example, silicon oxide ($SiO_2$) or silicon nitride (NiNx), which is an inorganic insulation material, is used for the interlayer insulating layer 115.

Subsequently, the interlayer insulating layer 115 is selectively patterned at the same time to form a drain contact hole (not shown) for exposing the drain electrode 113c of the drive thin film transistor (DTr). Here, during the patterning of the interlayer insulating layer 115, an interlayer insulating layer portion in the non-display area is etched at the same time.

Next, as illustrated in FIG. 10H, a third metal material layer 121 is deposited on the interlayer insulating layer 115, and then the third metal material layer 121 is selectively patterned to form a first electrode 121a brought into contact with the drain electrode 113c of the drive thin film transistor (DTr) and having a separated form for each pixel region (P) through the drain contact hole (not shown). Here, the third metal material layer buffer layer 121 is made of any one or two or more of aluminium (Al), aluminium alloy (AlNd), copper (Cu), copper alloy, molybdenum (Mo), molytitanium (MoTi), chromium (Cr), and titanium (Ti). Furthermore, during the patterning of the third metal material layer 121, a third metal material layer portion formed in the non-display area is etched, and at the same time a lateral surface portion of the metal pattern 107a thereunder is also etched, and thus the metal pattern 107a has a lateral surface in an inverse taper shape. In other words, the lateral surface in an inverse taper shape denotes that the width is formed to be narrower as it goes from a lower lateral surface of the metal pattern 107a to an upper lateral surface thereof.

Accordingly, the partition wall pattern 110 is formed with the layer structure of a metal pattern 107a in an inverse taper shape and an insulating layer 109a in a vertical cross-sectional shape. The metal pattern 107a is formed with the same metal layer as that of the gate electrode 107, and the insulating pattern 109a is formed with the same insulating layer as that of the insulating layer 109, and the metal layer has a characteristic with a faster etch rate compared to the insulation material layer. Furthermore, though it is described a case where the partition wall pattern 110 is formed with the layer structure of a metal pattern 107a made of the same metal layer as that of the gate electrode 107 and an insulating pattern 109a made of the same layer as that of the insulating layer 109 as an example in the present invention, it may not be limited to this, and it may be formed with the layer structure of a metal layer for the formation of a source electrode and a drain electrode and an interlayer insulating layer 115 formed thereon.

Subsequently, though not shown in the drawing, an insulation material layer (not shown) made of benzo-cyclo-butene (BCB), polyimide or photo acryl, for example, is formed in the boundary and non-display area (NA) of each pixel region (P) on the first electrode 121a.

Next, as illustrated in FIG. 10I, the insulation material layer (not shown) is selectively patterned to form banks 123, 123a. Here, the bank 123 is formed to be overlapped with the edge of the first electrode 121a in the form of surrounding the each pixel region (P), and the display area (AA) forms a lattice shape having a plurality of opening portions as a whole. Furthermore, the bank 123a is formed in the non-display area, which is a panel edge portion.

Subsequently, an organic light emitting layer 125 comprised of organic light emitting patterns (not shown) for emitting red, green and blue colors, respectively, is formed on the first electrode 121a within each of the pixel region (P) surrounded by the banks 123, 123a. Here, the organic light emitting layer 125 may be configured with a single layer made of an organic light emitting material, and otherwise, though not shown in the drawing, may be configured with a multiple layer with a hole injection layer, a hole transporting layer, an emitting material layer, an electron transporting layer, and an electron injection layer.

Next, as illustrated in FIG. 10J, a second electrode 127 is formed on an entire surface of the display area (AA) including an upper portion of the organic light emitting layer 125 and first and second banks 123, 123a. Here, a transparent conductive material for transmitting light, for example, any one of conductive materials including ITO and IZO may be selected and used for the second electrode 127. In this manner, the first electrode 121a and second electrode 127 and the organic light emitting layer 125 interposed between the two electrodes 121a, 127 form an organic light emitting diode (E).

Accordingly, for the organic light emitting diode (E), when a predetermined voltage is applied to the first electrode 121a and second electrode 127 according to the selected color signal, holes injected from the first electrode 121a and electrons provided from the second electrode 127 is transported to the organic light emitting layer 125 to form excitons, and light is generated and emitted in a visible light form when the excitons is transitioned from the excited state to the ground state. At this time, the emitted light is exited to the outside through the transparent second electrode 127, and thus the flexible organic electroluminescent device implements any image.

Figure 10L:
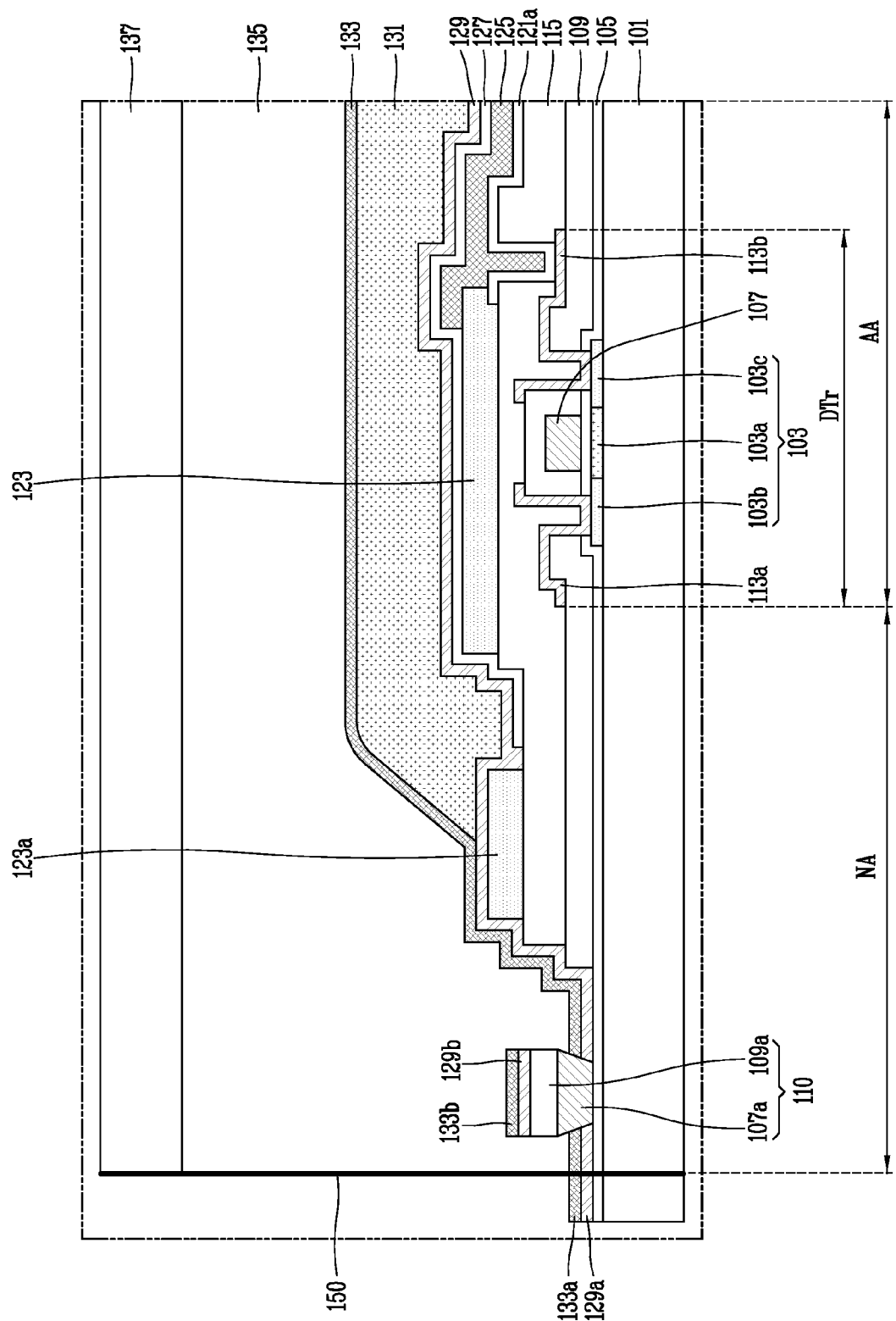

Subsequently, as illustrated in FIG. 10L, a first passivation layer 129 made of an insulation material, particularly, silicon oxide ($SiO_2$) or silicon nitride (NiNx), which is an inorganic insulation material, is formed on an entire surface of the substrate including the second electrode 127. Here, moisture infiltration to the organic light emitting layer 125 cannot be completely suppressed by only the second electrode 127, and thus the first passivation layer 129 is formed on the second electrode 127 to completely suppress moisture infiltration to the organic light emitting layer 125.

Furthermore, part of the first passivation layer 129, for example, a first portion 129a, is formed on the lateral surface of the partition wall pattern 130 in an inverse taper shape and the non-display area (NA), and a second portion 129b is formed only at an upper portion of the partition wall pattern 130. Here, the first portion 129a and second portion 129b are separated from each other. The partition wall pattern 130 is formed with a metal pattern 107a in an inverse taper shape and an insulating pattern 109a in a vertical cross-sectional shape.

Accordingly, the first portion 129a of the first passivation layer 129 is formed at a lateral surface of the metal pattern 107a of the partition wall pattern 130, and the second portion 129b is formed at an upper portion of the insulating pattern 109a of the partition wall pattern 130. It enables the separation between the first portion 129a and second portion 129b of the first passivation layer 129 since part of the first passivation layer 129 is formed at an inner side of the lateral surface of the metal pattern 107a in an inverse taper shape constituting the partition wall pattern 110 but not formed at a lateral surface of the insulating pattern 109a.

Next, an organic layer 131 made of a high organic molecular substance such as a polymer is formed in the display area (AA) on the first passivation layer 129. Here, olefin polymers (polyethylene, polypropylene), polyethylene terephthalate (PET), epoxy resin, fluororesin, polysiloxane, and the like may be used for a high molecular layer constituting the organic layer 131.

Subsequently, a second passivation layer 133 made of an insulation material, for example, silicon oxide (SiO2) or silicon nitride (NiNx), which is an inorganic insulation material, is additionally formed on an entire surface of the substrate 101 including the organic layer 131 and first passivation layer 129, 129a, 129b to block moisture from being infiltrated through the organic layer 131. Here, part of the second passivation layer 133, for example, a first portion 133a, is formed on a lateral surface portion of the partition wall pattern 130 in an inverse taper shape and a first portion 129a of the first passivation layer on the non-display area (NA), and a second portion 133b is formed only on a second portion 129b of the first passivation layer at an upper portion of the partition wall pattern 130. Here, the first portion 133a and second portion 133b of the second passivation layer are formed to be separated from each other similarly to the first portion 129a and second portion 129b of the first passivation layer.

Accordingly, the first portion 129a, 133a of the first and the second passivation layer 129, 133 is formed at a lateral surface portion of the metal pattern 107a of the partition wall pattern 130, and the second portion 129b, 133b is formed at an upper portion of the insulating pattern 109a of the partition wall pattern 130. It enables the separation between the first portion 129a, 133a and second portion 129b, 133b of the first and the second passivation layer 129, 133 since part of the first and the second passivation layer 129, 133 is formed at an inner side of the lateral surface of the metal pattern 107a in an inverse taper shape constituting the partition wall pattern 110 but not formed at a lateral surface of the insulating pattern 109a.

Next, an adhesive is located on an entire surface of the substrate including the second passivation layer 133 to face a barrier film 137 for the encapsulation of the organic light emitting diode (E), and the adhesive 135 made of any one of a frit having a transparent adhesive characteristic, an organic insulation material, and a high molecular substance is completely glued to the substrate 101 and barrier film 137 with no air layer and interposed between the substrate 101 and barrier film 137. Here, according to the present invention, a case of using a press sensitive adhesive (PSA) for the adhesive 135 will be described as an example.

In this manner, the substrate 101 is fixed to the barrier film 137 through the adhesive 135 to form a panel state, thereby completing the fabrication process of an organic electroluminescent device 100 according to the present invention.

As a result, according to a flexible organic electroluminescent device and a method of fabricating the same according to the present invention, a partition wall pattern in an inverse taper shape may be formed in the non-display area which is a panel edge portion of the organic electroluminescent device to surround the circumference of the display area which is a panel portion while separated from an organic layer formed in the display area, such that passivation layers laminated on the partition wall pattern are separated from passivation layers formed on an entire surface of the substrate, to prevent a crack generated on the passivation layer exposed to the outside when cutting a scribe line using a cutting wheel from being propagated into the panel, thereby suppressing moisture infiltration in a reliability environment.

In particular, a passivation layer exposed to the outside of the panel may be separately formed from a passivation layer formed at an upper portion of the partition wall pattern in an inverse taper shape and separated from a passivation layer formed at an inner portion of the panel, and thus a crack generated by an external shock may be blocked from being propagated into the panel due to the separated passivation layer, thereby suppressing moisture infiltration in a reliability environment.

Furthermore, according to a flexible organic electroluminescent device and a method of fabricating the same according to the present invention, a partition wall pattern in an inverse taper shape may be formed using layers with different etch rates such that a passivation layer formed at an upper portion of the partition wall pattern is separated from a passivation layer formed at a lateral wall of the partition wall pattern in an inverse taper shape, and thus a crack generated by an external shock may be blocked from being propagated into the panel due to the separated passivation layer, thereby suppressing moisture infiltration in a reliability environment.

Accordingly, according to a flexible organic electroluminescent device and a method of fabricating the same according to the present invention, crack propagation may be prevented during the occurrence of moisture permeation because a force may be exerted to a minute crack due to a scribe while performing the subsequent process to propagate and transmit the crack from the most outside edge to the display area, thereby reducing reliability failure.

However, it may be understood by those skilled in the art that the foregoing present invention can be implemented in other specific forms without changing the technical concept and essential characteristics thereof.

Therefore, it should be understood that the foregoing embodiments are merely illustrative but not restrictive in all aspects. The scope of the present invention is defined by the appended claims rather than by the detailed description, and all changes or modifications derived from the meaning, scope and equivalent concept of the claims should be construed to be embraced by the scope of the present invention.

What is claimed is:

1. A flexible organic electroluminescent device, comprising:
    a substrate defined with a display area including a plurality of pixel regions and a non-display area at the outside thereof;
    a switching thin film transistor and a drive thin film transistor at the each pixel region on the substrate;
    an interlayer insulating layer on the substrate including the switching thin film transistor and drive thin film transistor to expose a drain electrode of the drive thin film transistor;
    a partition wall pattern in the non-display area of the substrate to surround the circumference of the display area;
    a first electrode in each pixel region on the interlayer insulating layer, and connected to the drain electrode of the drive thin film transistor;
    a bank being around each pixel region and in the non-display area of the substrate including the first electrode;
    an organic light emitting layer being separately at each pixel region on the first electrode;
    a second electrode on an entire surface of the display area including the organic light emitting layer;
    a first passivation layer on an entire surface of the substrate including the second electrode and at an upper portion of the partition wall pattern;
    an organic layer on the first passivation layer of the display area;
    a second passivation layer at an upper portion of the organic layer and on the first passivation layer on an entire surface of the substrate and at an upper portion of the partition wall pattern;
    a barrier film located to face the substrate; and
    an adhesive interposed between the substrate and the barrier film to adhere the substrate to the barrier film,
    wherein the partition wall pattern is formed with the layer structure of a metal pattern and an insulating pattern.

2. The flexible organic electroluminescent device of claim 1, wherein the metal pattern has a lateral surface portion in an inverse taper shape, and the insulating pattern has a lateral surface portion in a vertical cross-sectional shape.

3. The flexible organic electroluminescent device of claim 1, wherein a portion of the first and the second passivation layer formed only at an upper portion of the partition wall pattern is separately formed from another portion of the first and the second passivation layer formed on the display area and non-display area.

4. The flexible organic electroluminescent device of claim 1, wherein the partition wall pattern is formed with the layer structure of a gate electrode of the thin-film transistor and an insulating layer formed on the gate electrode or formed with the layer structure of the drain electrode and interlayer insulating layer.

5. The flexible organic electroluminescent device of claim 1, wherein the substrate is configured with any one selected from a flexible glass substrate and a plastic material.

* * * * *